US012696630B2

(12) United States Patent
Oh

(10) Patent No.: US 12,696,630 B2
(45) Date of Patent: Jul. 28, 2026

(54) DISPLAY DEVICE

(71) Applicant: Samsung Display Co., LTD., Yongin-si (KR)

(72) Inventor: Myong Soo Oh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 545 days.

(21) Appl. No.: 18/144,015

(22) Filed: May 5, 2023

(65) Prior Publication Data

US 2024/0063350 A1 Feb. 22, 2024

(30) Foreign Application Priority Data

Aug. 16, 2022 (KR) ........................ 10-2022-0101910

(51) Int. Cl.
*H01L 33/54* (2010.01)
*H01L 25/075* (2006.01)
(Continued)

(52) U.S. Cl.
CPC ........... *H10K 59/124* (2023.02); *H05K 1/111* (2013.01); *H05K 3/323* (2013.01); *H10H 20/857* (2025.01);
(Continued)

(58) Field of Classification Search
CPC ..... H01L 23/562; H01L 23/564; H01L 23/58; H01L 23/585; H10K 50/8426;
(Continued)

(56) References Cited

U.S. PATENT DOCUMENTS 9,156,206 B2 * 10/2015 Masuda .................... B32B 3/02
9,515,092 B2 12/2016 Hwang et al.
(Continued)

FOREIGN PATENT DOCUMENTS

CN 107871714 A * 4/2018 ............. H10D 86/60
KR 100472172 6/2005
(Continued)

OTHER PUBLICATIONS

Machine translation, Kim, Chinese Pat. Pub. No. CN-107871714-A, translation date: Nov. 6, 2025, Clarivate Analytics, all pages. (Year: 2025).*

(Continued)

*Primary Examiner* — Victoria K. Hall
(74) *Attorney, Agent, or Firm* — CANTOR COLBURN LLP

(57) ABSTRACT

A display device including a display area, on which a plurality of pixels is disposed, and a pad area in a periphery of the display area, a first insulating layer disposed on the substrate, a pad electrode disposed on the first insulating layer in the pad area, a peeling prevention structure disposed on the first insulating layer in the pad area to be spaced apart from the pad electrode. The peeling prevention structure includes a first side surface facing the pad electrode and a second side surface opposite to the first side surface, and a second insulating layer disposed on the pad electrode and the peeling prevention structure. An end of the first insulating layer is in contact with the second side surface of the peeling prevention structure, and an end of the second insulating layer is aligned with a boundary of a top surface of the peeling prevention structure.

20 Claims, 19 Drawing Sheets

(51) Int. Cl.

| | |
|---|---|
| *H01L 33/62* | (2010.01) |
| *H05K 1/11* | (2006.01) |
| *H05K 3/321* | (2026.01) |
| *H10H 20/857* | (2025.01) |
| *H10K 59/124* | (2023.01) |
| *H10K 59/131* | (2023.01) |
| *H10K 59/38* | (2023.01) |
| *H10K 59/80* | (2023.01) |
| *H10K 59/88* | (2023.01) |
| *H10W 90/00* | (2026.01) |
| *H10H 20/853* | (2025.01) |
| *H10K 59/35* | (2023.01) |

(52) U.S. Cl.
CPC ........... *H10K 59/131* (2023.02); *H10K 59/38* (2023.02); *H10K 59/873* (2023.02); *H10K 59/88* (2023.02); *H10W 90/00* (2026.01); *H10H 20/853* (2025.01); *H10K 59/35* (2023.02); *H10K 59/8792* (2023.02)

(58) Field of Classification Search
CPC .. H10K 59/8722; H10K 59/131; H10K 71/50; H10K 71/80; H10K 71/861; B32B 38/10
See application file for complete search history.

(56) References Cited

U.S. PATENT DOCUMENTS

| | | |
|---|---|---|
| 10,998,391 B2 | 5/2021 | Bae et al. |
| 11,963,392 B2 | 4/2024 | Yoon et al. |

| | | | | |
|---|---|---|---|---|
| 2007/0253276 A1* | 11/2007 | Ochi | ........................ | H01L 24/06 |
| 2014/0367658 A1* | 12/2014 | Kwak | .................. | H10D 86/411 |
| | | | | 257/773 |
| 2015/0054006 A1* | 2/2015 | Okumura | ............... | H10K 71/18 |
| | | | | 257/89 |
| 2015/0194636 A1* | 7/2015 | Okumura | ............... | H10K 71/50 |
| | | | | 438/34 |
| 2015/0364432 A1* | 12/2015 | Chung | ................ | H01L 23/3114 |
| | | | | 438/109 |
| 2016/0165718 A1* | 6/2016 | Oh | ........................ | H05K 1/0268 |
| | | | | 361/749 |
| 2016/0225792 A1* | 8/2016 | Hwang | ................. | G02F 1/1345 |
| 2019/0165312 A1* | 5/2019 | Bae | ........................... | G09G 3/20 |
| 2021/0265454 A1* | 8/2021 | Lin | ...................... | H10K 59/873 |
| 2021/0408473 A1* | 12/2021 | Jiang | ................. | H10K 59/8722 |
| 2022/0199957 A1* | 6/2022 | Yoon | .................... | H10K 59/873 |

FOREIGN PATENT DOCUMENTS

| | | |
|---|---|---|
| KR | 1020160093775 A | 8/2016 |
| KR | 1020190064254 A | 6/2019 |
| KR | 20200073083 | 6/2020 |
| KR | 102335815 | 12/2021 |
| KR | 1020220090955 A | 6/2022 |

OTHER PUBLICATIONS

Korean Intellectual Property Office (KIPO), Written Decision on Registration, Korean Pat. App. No. 10-2022-0101910, Jan. 27, 2026, all pages. (Year: 2026).*

* cited by examiner

DISPLAY DEVICE

This application claims priority to Korean Patent Application No. 10-2022-0101910, filed on Aug. 16, 2022, and all the benefits accruing therefrom under 35 U.S.C. § 119, the content of which in its entirety is herein incorporated by reference.

BACKGROUND

1. Field

The disclosure relates to a display device.

2. Description of the Related Art

A display device is typically classified as a liquid crystal display (LCD), an organic light emitting diode display (OLED display), a plasma display panel (PDP), an electrophoretic display, and the like according to a driving method of a display panel.

The display panel may be partitioned into a display area in which an image is displayed and a non-display area at an edge of the display area. The display panel may include a plurality of gate lines, a plurality of data lines, and a plurality of pixels disposed in the display area. In addition, the display panel may include a plurality of pads disposed in the non-display area.

A driving integrated circuit (a gate integrated circuit and a data integrated circuit) to drive the display panel may be attached to the pad in the form of a tape automated bonding (TAB)-integrated circuit (IC). The TAB-IC may include a tape carrier package (TCP) in which a chip-type driving integrated circuit is mounted on a polymer film, and a chip on film (COF) in which a chip-type driving integrated circuit is mounted on a flexible print circuit board (FPCB).

SUMMARY

In a display device where a driving integrated circuit is attached to a pad of a display panel thereof in the form of a TAB-IC, it is desired to remove the TAB-IC and reuse the display panel when a defect is detected in the TAB-IC. In this case, the pad of the display panel may be separated together with the TAB-IC in a process of separating the TAB-IC from the display panel, such that the display panel may not be reused.

Embodiments of the disclosure provide a display device capable of preventing damage to a pad that may occur when a TAB-IC is separated from a display panel thereof by disposing a peeling prevention structure in an area adjacent to a pad portion to reuse the display panel.

An embodiment of a display device includes a display device including a substrate including a display area, on which a plurality of pixels is disposed, and a pad area positioned in a periphery of the display area, a first insulating layer disposed on the substrate, a pad electrode disposed on the first insulating layer in the pad area, a peeling prevention structure disposed on the first insulating layer in the pad area to be spaced apart from the pad electrode, where the peeling prevention structure includes a first side surface facing the pad electrode and a second side surface opposite to the first side surface, and a second insulating layer disposed on the pad electrode and the peeling prevention structure, where an end of the first insulating layer is in contact with the first side surface of the peeling prevention structure, and an end of the second insulating layer is aligned with a boundary of a top surface of the peeling prevention structure.

In an embodiment, the end of the second insulating layer may cover a part of the second side surface and the top surface and of the peeling prevention structure.

In an embodiment, the first side surface and the second side surface of the peeling prevention structure may have a reverse taper slope.

In an embodiment, the display device may further include a first residue pattern partially positioned on the second side surface of the peeling prevention structure and a second residue pattern including a material different from the first residue pattern.

In an embodiment, the first residue pattern may include a same material as the first insulating layer, and the second residue pattern may include a same material as the second insulating layer.

In an embodiment, the top surface of the peeling prevention structure may be higher than a top surface of the first insulating layer.

In an embodiment, the display device may further include a dummy line disposed between the substrate and the first insulating layer, where the pad electrode and the peeling prevention structure are in contact with the dummy line.

In an embodiment, a top surface of the dummy line disposed on a portion of the substrate positioned outside the second side surface of the peeling prevention structure may be exposed.

In an embodiment, a top surface of the pad electrode and the top surface of the peeling prevention structure may be positioned in a same level.

In an embodiment, the second insulating layer may expose at least a part of the top surface of the peeling prevention structure.

In an embodiment, the pad electrode and the peeling prevention structure may include a same material as each other, and the pad electrode and the peeling prevention structure are formed by a same process as each other.

In an embodiment, the pad electrode may include a first pad electrode in contact with the first insulating layer and a second pad electrode positioned on the first pad electrode, and the first pad electrode and the second pad electrode may include different materials from each other.

In an embodiment, the peeling prevention structure may include a first peeling prevention structure layer including a same material as that of the first pad electrode, and disposed in a same layer as the first pad electrode, and a second peeling prevention structure layer including a same material as the second pad electrode, and disposed in a same layer as the second pad electrode.

In an embodiment, the display device may further include a flexible circuit board comprising a lead electrode electrically connected to the pad electrode, and an anisotropic conductive film positioned between the flexible circuit board and the substrate, where the anisotropic conductive film may include an insulating resin and a plurality of conductive balls dispersed in the insulating resin, the conductive ball may be in contact with the lead electrode and the pad electrode, and the insulating resin may be in direct contact with the top surface of the dummy line.

An embodiment of a display device includes a substrate including a display area, on which a plurality of pixels are disposed, and a pad area positioned in a periphery of the display area, a first insulating layer disposed on the substrate, a first pad electrode and a second pad electrode which are disposed on the first insulating layer in the pad area and arranged in a first direction, a first peeling prevention structure disposed on the first insulating layer in the pad area to be spaced apart from the first pad electrode in a second direction intersecting the first direction, where the first peeling prevention structure includes a first side surface facing the first pad electrode and a second side surface opposite to the first side surface thereof, a second peeling prevention structure disposed on the first insulating layer in the pad area to be spaced apart from the second pad electrode in the second direction, where the second peeling prevention structure includes a first side surface facing the second pad electrode and a second side surface opposite to the first side surface thereof, and a second insulating layer disposed on the first pad electrode, the second pad electrode, the first peeling prevention structure, and the second peeling prevention structure, where at least a part of the substrate positioned outside the second side surface of the first peeling prevention structure is exposed, and a portion of the substrate positioned outside the second side surface of the second peeling prevention structure is covered by the second insulating layer.

In an embodiment, the first insulating layer and the second insulating layer may be in contact with the second side surface of the second peeling prevention structure.

In an embodiment, the display device may further include a first residue pattern partially positioned on the second side surface of the first peeling prevention structure, and a second residue pattern including a material different from the first residue pattern, where the first residue pattern may include a same material as the first insulating layer, and the second residue pattern may include a same material as the second insulating layer.

In an embodiment, the display device may further include a third pad electrode disposed on the first insulating layer in the pad area, and spaced apart from the first pad electrode and the second pad electrode in the first direction, where the first insulating layer and the second insulating layer may cover an end of the third pad electrode, and a side surface of the first insulating layer and a side surface of the second insulating layer which cover the end of the third pad electrode may be exposed.

In an embodiment, the display device may further include a first dummy line disposed between the substrate and the first insulating layer in the pad area and connected to the first pad electrode, and a second dummy line disposed between the substrate and the first insulating layer in the pad area and connected to the second pad electrode.

In an embodiment, a top surface of the first dummy line disposed on a portion of the substrate positioned outside the second side surface of the first peeling prevention structure may be exposed, and a top surface of the second dummy line disposed on a portion of the substrate positioned outside the second side surface of the second peeling prevention structure may be covered by the first insulating layer and the second insulating layer.

In embodiments of the invention, as described herein, the display device may prevent damage to the pad that may occur when the TAB-IC is separated from the display panel to reuse the display panel, so that productivity of the display device may be improved.

However, the effects of the disclosure are not limited to the aforementioned effects, and various other effects are included in the disclosure.

BRIEF DESCRIPTION OF THE DRAWINGS

The above and other features of embodiments of the disclosure will become more apparent by describing in detail embodiments thereof with reference to the attached drawings, in which:

FIG. 5 is a cross-sectional view schematically illustrating a cross section taken along line I-I' of FIGS. 3 and 4;

FIG. 9 is a cross-sectional view illustrating a state in which the flexible circuit board is separated from the pad area according to an embodiment;

DETAILED DESCRIPTION

Figure 1:
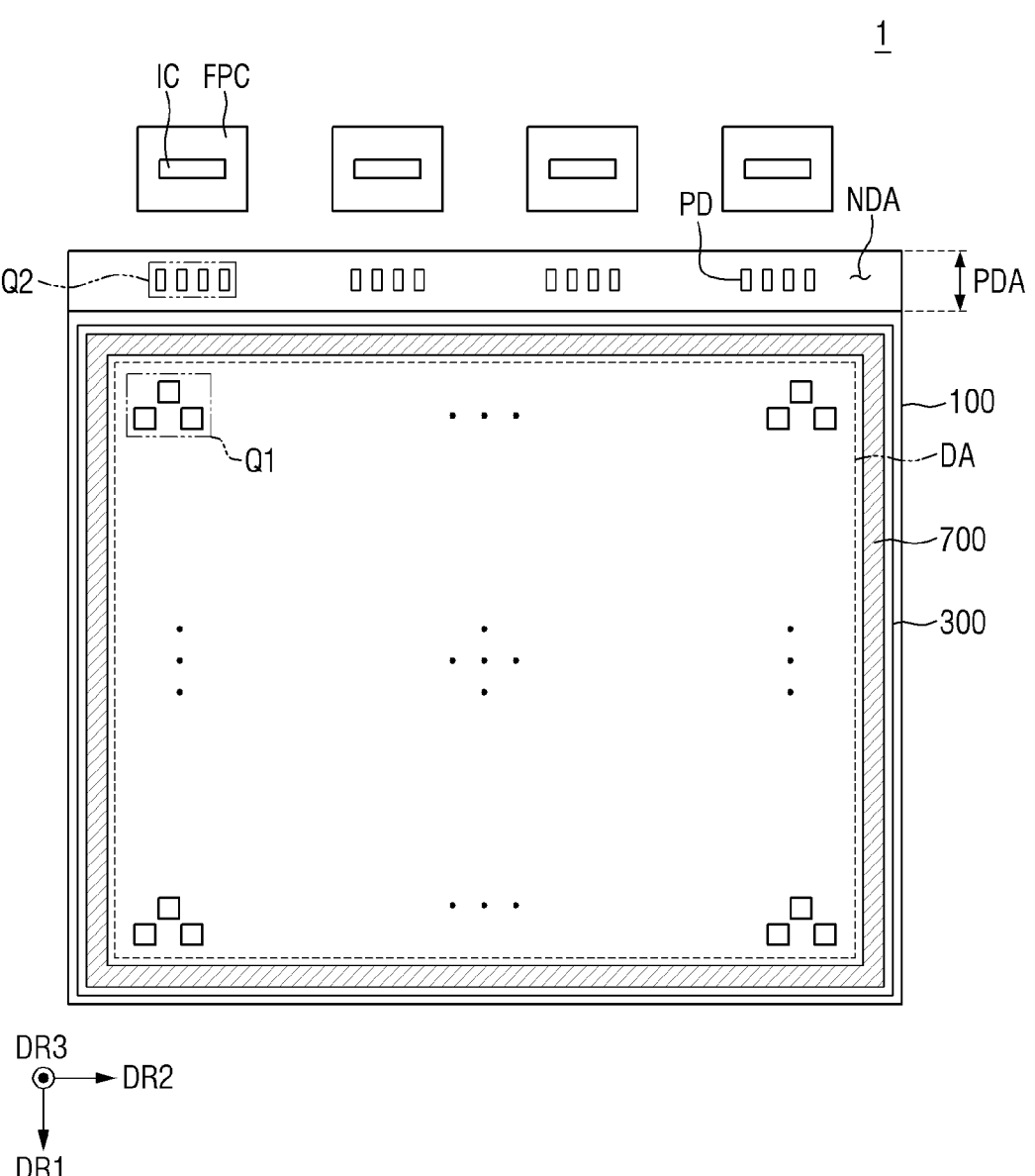
FIG. 1 is a schematic plan view of a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the accompanying drawings.

Figure 2:
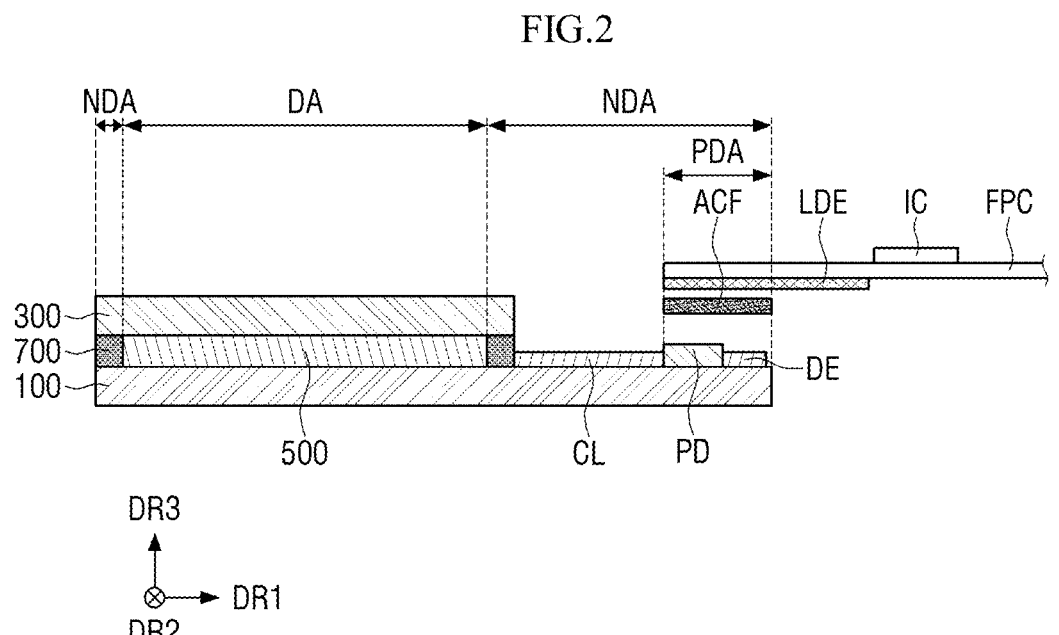
FIG. 2 is a schematic cross-sectional view of the display device of FIG. 1.

FIG. 1 is a schematic plan view of a display device according to an embodiment. FIG. 2 is a schematic cross-sectional view of the display device of FIG. 1.

Referring to FIGS. 1 and 2, a display device 1 according to an embodiment may be applied to (or included in) portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. Alternatively, the display device 1 according to an embodiment may be applied as a display unit of a television, a laptop, a monitor, a billboard, or an Internet-of-Things (IoT) terminal. These are merely listed as examples, and the display device 1 may also be applied to other electronic devices without departing from teachings herein.

In the drawing, the direction parallel to the first side of the display device 1 is indicated as a first direction DR1, the direction parallel to the second side of the display device 1 is indicated as a second direction DR2, and the direction perpendicular to the first direction DR1 and the second direction DR2 (or a thickness direction of the display device 1) is indicated as a third direction DR3. In the following description, unless otherwise stated, "direction" may refer to both of directions extending along the direction. Further, when distinguishing opposite "directions" extending in opposing sides, one side will be referred to as "one side in the direction" and the other side will be referred to as "the other side in the direction." Referring to FIG. 1, a direction in which an arrow is directed is referred to as one side, and the opposite direction is referred to as the other side. The first direction DR1 and the second direction DR2 may be perpendicular to each other, the first direction DR1 and the third direction DR3 may be perpendicular to each other, and the second direction DR2 and the third direction DR3 may be perpendicular to each other.

In some embodiments, the display device 1 may have a planar shape similar to a quadrilateral shape. In such embodiments, the display device 1 may have a planar shape similar to a quadrilateral shape having long sides in the first direction DR1 and short sides in the second direction DR2, as shown in FIG. 1, but is not limited thereto. In an embodiment, for example, in a planar shape of the display device 1, a corner at which a long side in the first direction DR1 and a short side in the second direction DR2 meet may be formed to be rounded and have a predetermined curvature or may be formed at a right angle, or may not be limited to a quadrilateral shape, or may be formed similarly to other polygonal shapes, a circular shape, or an elliptical shape.

The display device 1 may include a display area DA, in which a screen is defined or an image is displayed, and a non-display area NDA, in which no image is displayed. In some embodiments, the non-display area NDA may be disposed to surround the edge of the display area DA, but the disclosure is not limited thereto. An image displayed in the display area DA may be viewed by a user on one side in the third direction DR3 with reference to FIG. 1.

The non-display area NDA of the display device 1 may include a pad area PDA, and a plurality of pads PD and a plurality of dummy lines DE (shown in FIG. 6) may be positioned in the pad area PDA. The pad area PDA may be defined on a light emitting portion 100. Accordingly, the plurality of pads PD may be disposed on the light emitting portion 100.

A connection line CL connected to the pad PD may extend from the non-display area NDA to the display area DA to connect the gate line or data line with the pad PD.

The dummy line DE may be connected to the pad PD and may be disposed at an edge of the light emitting portion 100. That is, the dummy line DE connected to the pad PD may extend toward the edge of the light emitting portion 100.

A flexible circuit board FPC may include a driving chip IC disposed on one surface (a first surface or a top surface) of the flexible circuit board FPC and a plurality of lead electrodes LE disposed on the other surface (a second surface or bottom surface) thereof. In an embodiment, a driving chip may be an integrated circuit chip.

The lead electrode LDE of the flexible circuit board FPC may be electrically connected to the pad PD by an anisotropic conductive film ACF including a plurality of conductive balls CB (shown in FIG. 8) to be described later. The flexible circuit board FPC may electrically connect the light emitting portion 100 to a circuit board or the like that provide a signal, power, or the like for driving the display device 1.

The driving chip IC may be electrically connected to the circuit board or the like to receive data, a signal, and the like. In some embodiments, the driving chip IC may be a data driving chip, may receive a data control signal, image data, or the like from the circuit board or the like, and may generate and output a data voltage and the like corresponding to the image data.

The driving chip IC may be mounted on the flexible circuit board FPC. In an embodiment, for example, the driving chip IC may be mounted on the flexible circuit board FPC in the form of a chip on film (COF). The data voltage provided from the driving chip IC, the power provided from the circuit board, or the like may be transmitted to the pixel circuit or the like of the light emitting portion 100 via the flexible circuit board FPC and the pad PD, as will be described later.

The light emitting portion 100 may include elements and circuits for displaying an image, for example, a pixel circuit such as a switching element, a pixel defining layer 170 (shown in FIG. 5) and a self-light emitting element that define emission area and a non-emission area, which will be described later, in the display area DA. In an embodiment, the self-light emitting element may include at least one selected from an organic light emitting element (organic light emitting diode), a quantum dot light emitting element (quantum dot light emitting diode), an inorganic material-based micro light emitting diode (e.g., micro LED), and an inorganic material-based light emitting diode (e.g., nano LED) having a nano size. Hereinafter, for simplicity of description, embodiments in which the self-light emitting element is an organic light emitting element will be described as an example.

The light transmitting portion 300 may be positioned on the light emitting portion 100 and may face the light emitting portion 100. In some embodiments, the light transmitting portion 300 may include a color conversion pattern for converting a color of incident light emitted from the light emitting portion 100 and radiated to the light transmitting portion 300. In some embodiments, the light transmitting portion 300 may include at least one selected from a color filter member 320 and a light transmitting member, which will be described later, as a color conversion pattern. In some embodiments, the light transmitting portion 300 may include both the color filter member 320 (shown in FIG. 5) and the light transmitting member. The light transmitting member may include at least one selected from a wavelength conversion shifter and a light scatterer, as will be described later.

A sealing member 700 may be positioned between the light emitting portion 100 and the light transmitting portion 300 in the non-display area NDA. The sealing member 700 may be disposed along edges of the light emitting portion 100 and the light transmitting portion 300 in the non-display area NDA to surround the display area DA in a plan view. The light emitting portion 100 and the light transmitting portion 300 may be coupled to each other via the sealing member 700.

In some embodiments, the sealing member 700 may include or be made of an organic material. In an embodiment, for example, the sealing member 700 may be made of an epoxy-based resin, but is not limited thereto. In some other embodiments, the sealing member 700 may be applied in the form of a frit including glass or the like.

A filling portion 500 may be positioned in a space between the light emitting portion 100 and the light transmitting portion 300 surrounded by the sealing member 700. The filling portion 500 may fill the space between the light emitting portion 100 and the light transmitting portion 300.

In some embodiments, the filling portion 500 may include or be made of a material that can transmit light. In some embodiments, the filling portion 500 may include or be made of an organic material. In an embodiment, for example, the filling portion 500 may be made of a silicone-based organic material, an epoxy-based organic material, a mixture of a silicone-based organic material and an epoxy-based organic material, or the like.

Hereinafter, the plurality of emission areas defined in the light emitting portion 100 of the display device 1 and a plurality of transmission areas defined in the light transmitting portion 300 will be described in greater detail.

Figure 3:
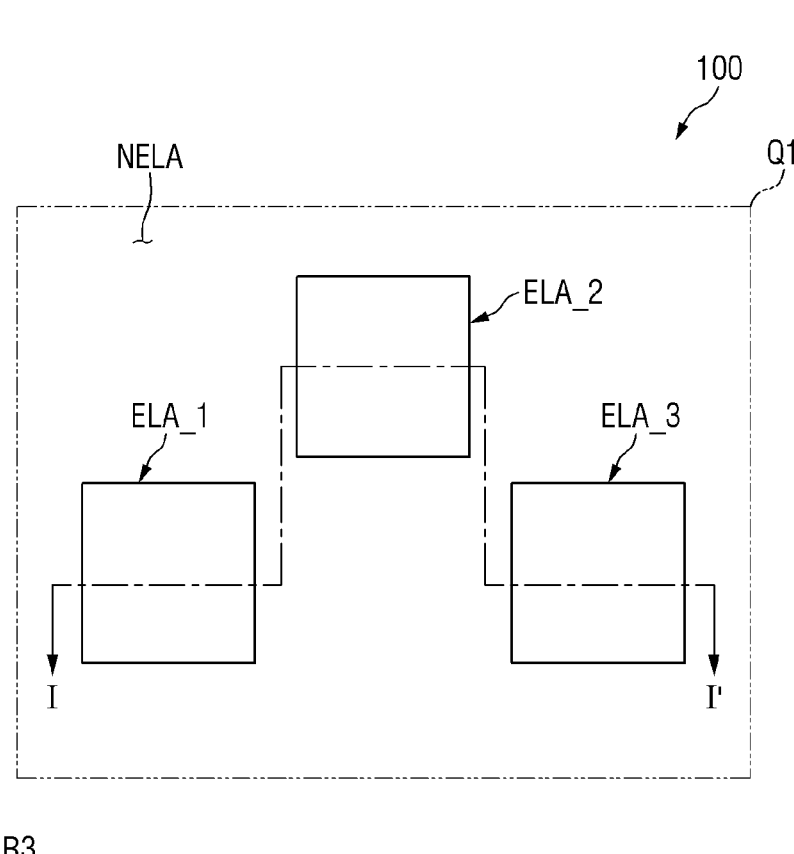
FIG. 3 is an enlarged plan view of portion Q1 of FIG. 1, and more specifically, is a schematic plan view of a light emitting portion included in the display device of FIG. 1.
Figure 3:
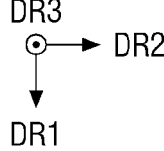
Figure 4:
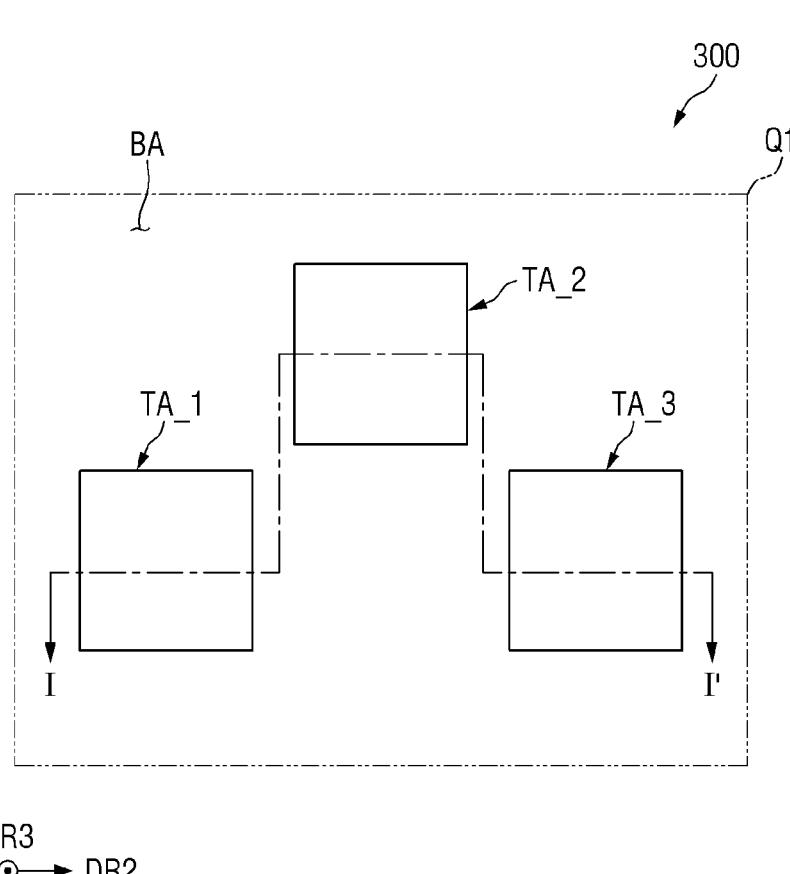
FIG. 4 is an enlarged plan view of portion Q1 of FIG. 1, and more specifically, is a schematic plan view of a light transmitting portion included in the display device of FIG. 1.
Figure 4:
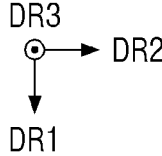
Figure 5:
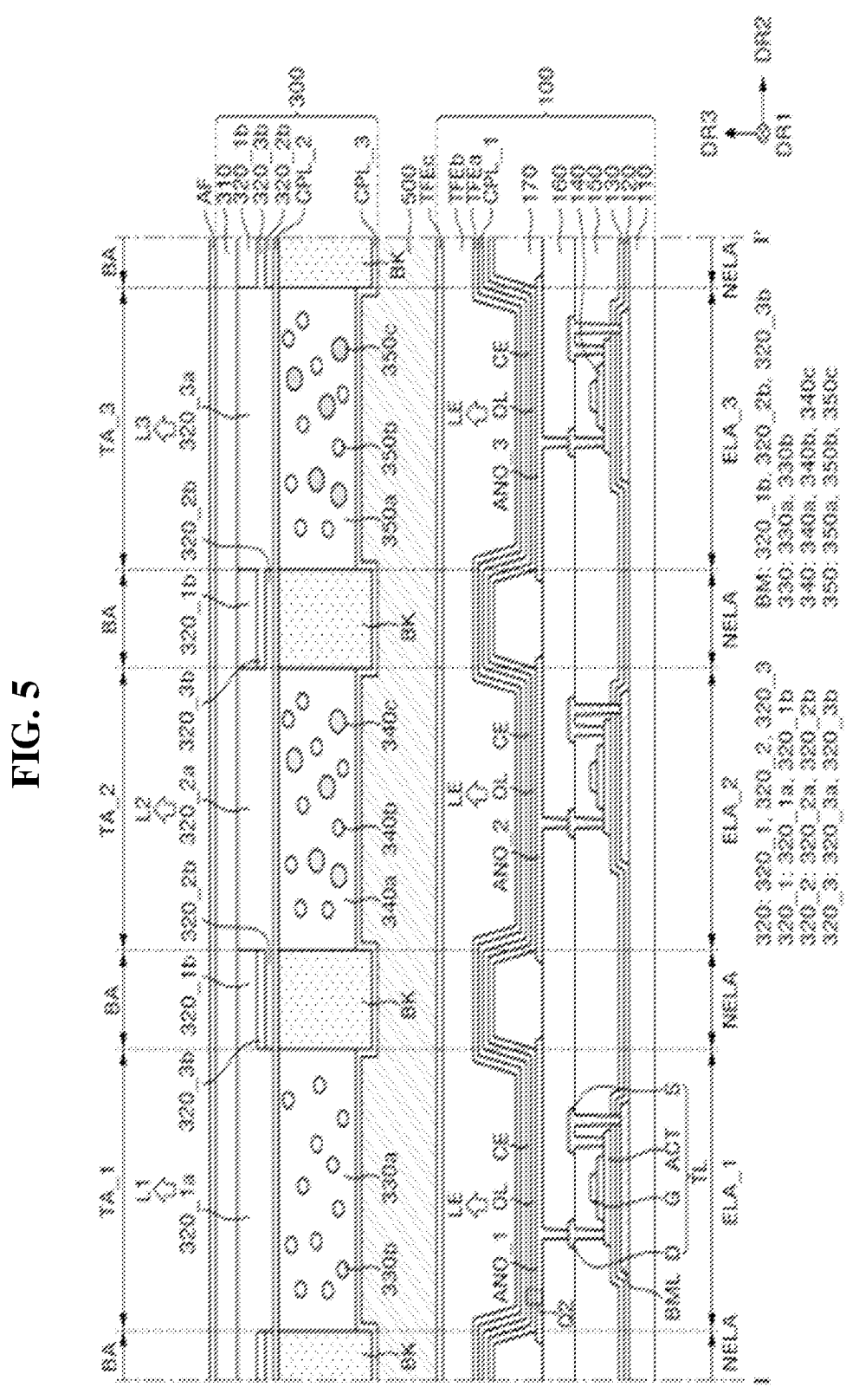

FIG. 3 is an enlarged plan view of portion Q1 of FIG. 1, and more specifically, is a schematic plan view of a light emitting portion included in the display device of FIG. 1. FIG. 4 is an enlarged plan view of portion Q1 of FIG. 1, and more specifically, is a schematic plan view of a light transmitting portion included in the display device of FIG. 1. FIG. 5 is a cross-sectional view schematically illustrating a cross section taken along line I-I' of FIGS. 3 and 4.

Referring to FIGS. 3 to 5, in an embodiment, the display area DA and the non-display area NDA defined in the display device 1 may be defined in the light emitting portion 100 and the light transmitting portion 300.

As illustrated in FIG. 3, in an embodiment, a first emission area ELA_1, a second emission area ELA_2, and a third emission area ELA_3 may be defined in the display area DA of the light emitting portion 100. The first emission area ELA_1, the second emission area ELA_2, and the third emission area ELA_3 may be areas in which light generated by the light emitting element of the light emitting portion 100 is emitted to the outside of the light emitting portion 100, and a non-emission area NELA may be an area in which light is not emitted to the outside of the light emitting portion 100. In some embodiments, the non-emission area NELA may surround the first emission area ELA_1, the second emission area ELA_2, and the third emission area ELA_3 within the display area DA, but is not limited thereto.

In some embodiments, light emitted to the outside from the first emission area ELA_1, the second emission area ELA_2, and the third emission area ELA_3 may be light of the first color. In some embodiments, the light of the first color may be blue light, and may have a peak wavelength in a range of about 440 nanometers (nm) to about 480 nm. Here, the peak wavelength means a wavelength at which the intensity of light is maximum. In some embodiments, as illustrated in FIG. 3, the first emission area ELA_1 and the third emission area ELA_3 are sequentially positioned along the second direction DR2, and the second emission area ELA_2 is positioned on one side of the first emission area ELA_1 and the third emission area ELA_3 along the first direction DR1, so that the first emission area ELA_1, the second emission area ELA_2, and the third emission area ELA_3 may form one group. In an embodiment, as illustrated in FIG. 3, one group formed by the first emission area ELA_1, the second emission area ELA_2, and the third emission area ELA_3 may be repeatedly disposed along the first direction DR1 and the second direction DR2 in the display area DA, but the disclosure is not limited thereto. In an alternative embodiment, for example, the disposition of the first emission area ELA_1, the second emission area ELA_2, and the third emission area ELA_3 may be variously changed, so that the first emission area ELA_1, the second emission area ELA_2, and the third emission area ELA_3 may be sequentially positioned along the second direction DR2. Hereinafter, for simplicity of description, embodiments in which the first emission area ELA_1, the second emission area ELA_2, and the third emission area ELA_3 are disposed as illustrated in FIG. 3 will be described as an example.

In some embodiments, the area (e.g., a planar area) of the first emission area ELA_1, the area of the second emission area ELA_2, and the area of the third emission area ELA_3 may be substantially the same as each other, but are not limited thereto. In an embodiment, for example, the area of the first emission area ELA_1, the area of the second emission area ELA_2, and the area of the third emission area ELA_3 may be different from each other. In some embodiments, the first emission area ELA_1, the second emission area ELA_2, and the third emission area ELA_3 may have a square planar shape, but are not limited thereto. Hereinafter, for simplicity of description, description will be made focusing on embodiments where the first emission area ELA_1, the second emission area ELA_2, and the third emission area ELA_3 have a square planar shape and have substantially a same area as each other.

Referring to FIG. 4, a first transmission area TA_1, a second transmission area TA_2, and a third transmission area TA_3 may be defined in the display area DA of the light transmitting portion 300. The first transmission area TA_1, the second transmission area TA_2, and the third transmission area TA_3 may be areas through which the light generated in the first emission area ELA_1, the second emission area ELA_2, and the third emission area ELA_3 of the light emitting portion 100 passes.

A light blocking area BA may be positioned in the periphery of the first transmission area TA_1, the second transmission area TA_2, and the third transmission area TA_3 in the display area DA of the light transmitting portion 300. In some embodiments, the light blocking area BA may surround the first transmission area TA_1, the second transmission area TA_2, and the third transmission area TA_3, but is not limited thereto. In an embodiment, for example, the light blocking area BA may be positioned in the non-display area NDA as well as the display area DA of the light transmitting portion 300.

The first transmission area TA_1 may correspond to and overlap the first emission area ELA_1, the second transmission area TA_2 may correspond to and overlap the second emission area ELA_2, and the third transmission area TA_3 may correspond to and overlap the third emission area ELA_3.

In some embodiments, the first transmission area TA_1 may have substantially the same area as the first emission area ELA_1 and completely overlap the first emission area ELA_1, the second transmission area TA_2 may have substantially the same area as the second emission area ELA_2 and completely overlap the second emission area ELA_2, and the third transmission area TA_3 may have substantially the same area as the third emission area ELA_3 and completely overlap the third emission area ELA_3, but the disclosure is not limited thereto. In an alternative embodiment, for example, the first transmission area TA_1 may have a different area from the first emission area ELA_1, the second transmission area TA_2 may have a different area from the second emission area ELA_2, and the third transmission area TA_3 may have a different area from the third emission area ELA_3.

Hereinafter, for simplicity of description, description will be made focusing on embodiments where the first transmission area TA_1 may have substantially the same area as the first emission area ELA_1 and completely overlap the first emission area ELA_1, the second transmission area TA_2 may have substantially the same area as the second emission area ELA_2 and completely overlap the second emission area ELA_2, and the third transmission area TA_3 may have substantially the same area as the third emission area ELA_3 and completely overlap the third emission area ELA_3.

In an embodiment, the first transmission area TA_1 and the third transmission area TA_3 are sequentially positioned along the second direction DR2, and the second transmission area TA_2 is positioned on one side of the first transmission area TA_1 and the third transmission area TA_3 along the first direction DR1, so that the first transmission area TA_1, the second transmission area TA_2, and the third transmission area TA_3 may form a group. In an embodiment, as illustrated in FIG. 4, one group formed by the first transmission area TA_1, the second transmission area TA_2, and the third transmission area TA_3 may be repeatedly disposed along the first direction DR1 and the second direction DR2 in the display area DA.

As described above, the light of the first color provided from the light emitting portion 100 may pass through the first transmission area TA_1, the second transmission area TA_2, and the third transmission area TA_3 to be provided to the outside of the display device 1.

When the light emitted from the first transmission area TA_1 to the outside of the display device 1 is referred to as a first emission light L1, the light emitted from the second transmission area TA_2 to the outside of the display device 1 is referred to as a second emission light L2, and the light emitted from the third transmission area TA_3 to the outside of the display device 1 is referred to as a third emission light L3, the first emission light L1 may be light of the first color, the second emission light L2 may be light of the second color, and the third emission light L3 may be light of the third color.

In some embodiments, the light of the first color may be blue light having a peak wavelength in a range of about 440 nm to about 480 nm as described above, and the light of the second color may be green light having a peak wavelength in a range of about 510 nm to about 550 nm. In addition, the light of the third color may be red light having a peak wavelength in a range of about 610 nm to about 650 nm.

Referring to FIG. 5, as described above, an embodiment of the display device 1 may include the light emitting portion 100, the light transmitting portion 300 disposed on the light emitting portion 100 to face the light emitting portion 100, and the filling portion 500 interposed between the light emitting portion 100 and the light transmitting portion 300. Hereinafter, for simplicity of description, the light emitting portion 100, the light transmitting portion 300, and the filling portion 500 will be described in order.

The light emitting portion 100 may be a structure in which a first substrate 110, a lower metal layer BML, a buffer layer 120, a first insulating layer 130, a semiconductor layer ACT, a gate electrode G, a gate insulating layer 140, a second insulating layer 150, a source electrode S and a drain electrode D, a third insulating layer 160, a light emitting element, the pixel defining layer 170, a first capping layer CPL_1, and a thin film encapsulation layer are sequentially stacked on in the third direction DR3.

The first substrate 110 of the light emitting portion 100 may serve as a base of the light emitting portion 100. The first substrate 110 may include or be made of a light transmitting material. The first substrate 110 may be a glass substrate or a plastic substrate. In an embodiment where the first substrate 110 is a plastic substrate, the first substrate 110 may have flexibility. In an alternative embodiment, where the first substrate 110 is a plastic substrate, the first substrate 110 may include polyimide, but is not limited thereto.

The lower metal layer BML of the light emitting portion 100 may be disposed on the first substrate 110. The lower metal layer BML may block external light or light emitted from a light emitting element to be described later from being introduced into the semiconductor layer ACT. Accordingly, it is possible to prevent or reduce the occurrence of leakage current due to light in the thin film transistor to be described later.

The lower metal layer BML may include or be made of a material that blocks light and has conductivity. In some embodiments, the lower metal layer BML may include a single material of metal such as silver (Ag), nickel (Ni), gold (Au), platinum (Pt), aluminum (Al), copper (Cu), molybdenum (Mo), titanium (Ti), or neodymium (Nd), or an alloy thereof. In some embodiments, the lower metal layer BML may have a single-layer or multilayer structure. In an embodiment, for example, where the lower metal layer BML has a multilayer structure, the lower metal layer BML may have a stacked structure of titanium (Ti)/copper (Cu)/indium tin oxide (ITO), or a stacked structure of titanium (Ti)/copper (Cu)/aluminum oxide (Al₂O₃), but is not limited thereto.

In some embodiments, a plurality of lower metal layers BML may be provided to respectively correspond to the semiconductor layers ACT and may overlap the semiconductor layers ACT. In some embodiments, the width of the lower metal layer BML may be greater than the width of the semiconductor layer ACT.

In some embodiments, the lower metal layer BML may be a part of a conductive layer that defines a data line, a power supply line, a line that electrically connects the thin film transistor (not illustrated in the drawing) and the thin film transistor (G, ACT, D, and S in FIG. 5) illustrated in the drawing to each other, or the like. In some embodiments, the lower metal layer BML may include or be made of a material having a lower resistance than the resistance of the source electrode S and the drain electrode D.

The buffer layer 120 of the light emitting portion 100 may cover the lower metal layer BML and may be disposed on the lower metal layer BML. The buffer layer 120 may serve to block foreign matter or moisture penetrating through the first substrate 110 to the element disposed on the buffer layer 120.

In some embodiments, the buffer layer 120 may include an inorganic material such as $SiO_2$, SiNx, or SiON, and may be formed as a single layer or multilayer, but is not limited thereto.

The first insulating layer 130 of the light emitting portion 100 may be disposed on the buffer layer 120. The first insulating layer 130 may serve to electrically insulate the lower metal layer BML from the semiconductor layer ACT. The first insulating layer 130 may cover the lower metal layer BML.

In some embodiments, the first insulating layer 130 may include an inorganic material such as $SiO_2$, SiNx, SiON, $Al_2O_3$, $TiO_2$, $Ta_2O$, $HfO_2$, or $ZrO_2$.

The semiconductor layer ACT of the light emitting portion 100 may be disposed on the first insulating layer 130. The semiconductor layer ACT may be disposed to correspond to each of the first emission area ELA_1, the second emission area ELA_2, and the third emission area ELA_3 in the display area DA of the light emitting portion 100. Further, the semiconductor layer ACT may be disposed to overlap the lower metal layer BML, thereby suppressing generation of a photocurrent in the semiconductor layer ACT.

The semiconductor layer ACT may include an oxide semiconductor. In some embodiments, the semiconductor layer ACT may include or be formed of a Zn oxide-based material, e.g., Zn oxide, In—Zn oxide, or Ga—In—Zn oxide, and may be an In—Ga—Zn—O (IGZO) semiconductor containing a metal such as indium (In) or gallium (Ga), but is not limited thereto. In an alternative embodiment, for example, the semiconductor layer ACT may include amorphous silicon or polysilicon.

The gate electrode G of the light emitting portion 100 may be disposed on the semiconductor layer ACT. The gate electrode G may be disposed to overlap the semiconductor layer ACT in the display area DA. In some embodiments, the width of the gate electrode G may be narrower than the width of the semiconductor layer ACT, but is not limited thereto.

In some embodiments, the gate electrode G may include at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in consideration of adhesion with an adjacent layer, surface flatness of a stacked layer, processability, and the like, and may be formed into a single layer or multiple layers, but is not limited thereto.

The gate insulating layer 140 of the light emitting portion 100 may be disposed between the semiconductor layer ACT and the gate electrode G. The gate insulating layer 140 may insulate the semiconductor layer ACT from the gate electrode G. In some embodiments, the gate insulating layer 140 may not be constituted with a single layer disposed on one side of the first substrate 110 in the third direction DR3 but be constituted with a partially patterned shape, and the width of the gate insulating layer 140 may be narrower than the width of the semiconductor layer ACT and be wider than the width of the gate electrode G, but is not limited thereto.

In some embodiments, the gate insulating layer 140 may include an inorganic material. In an embodiment, for example, the gate insulating layer 140 may include the inorganic material listed above in the description of the first insulating layer 130.

The second insulating layer 150 of the light emitting portion 100 may be disposed on the gate insulating layer 140 to cover the semiconductor layer ACT and the gate electrode G. In some embodiments, the second insulating layer 150 may function as a planarization layer for providing a flat surface on elements therebelow.

The second insulating layer 150 may include an organic material. In some embodiments, the second insulating layer 150 may include at least one selected from photo acryl (PAC), polystyrene, polymethylmethacrylate (PMMA), polyacrylonitrile (PAN), polyamide, polyimide, polyarylether, heterocyclic polymer, parylene, fluorine-based polymer, epoxy resin, benzocyclobutene-based resin, siloxane-based resin, and silane resin, but the disclosure is not limited thereto.

The source electrode S and the drain electrode D of the light emitting portion 100 may be spaced apart from each other and disposed on the second insulating layer 150. The source electrode S and the drain electrode D may be connected to the semiconductor layer ACT through contact holes defined through the buffer layer 120 and the second insulating layer 150, respectively. In some embodiments, the source electrode S may penetrate the first insulating layer 130 as well as the second insulating layer 150 and may be connected to the lower metal layer BML. In an embodiment where the lower metal layer BML is a part of a line that transmits a signal, a voltage, or the like, the source electrode S may be connected and electrically coupled to the lower metal layer BML to receive a transmitted voltage and the like provided to the line. In an alternative embodiment where the lower metal layer BML is a floating pattern rather than a part of a line, a voltage and the like provided to the source electrode S may be transmitted to the lower metal layer BML or the like.

The source electrode S and the drain electrode D may include aluminum (Al), copper (Cu), titanium (Ti), or the like, and may be formed as a multilayer or a single layer. In some embodiments, the source electrode S and the drain electrode D may have a multilayer structure of Ti/Al/Ti, but are not limited thereto.

The semiconductor layer ACT, the gate electrode G, the source electrode S, and the drain electrode D described above may form (or collectively define) a thin film transistor that is a switching element. In some embodiments, the thin film transistor may be positioned in each of the first emission area ELA_1, the second emission area ELA_2, and the third emission area ELA_3. In some embodiments, a part of the thin film transistor may be positioned in the non-emission area NELA.

The third insulating layer 160 of the light emitting portion 100 may be disposed on the second insulating layer 150 to cover the thin film transistor. In some embodiments, the third insulating layer 160 may be a planarization layer.

The third insulating layer 160 may include or be made of an organic material. In some embodiments, the third insulating layer 160 may include an acrylic resin, an epoxy resin, an imide resin, an ester resin, or the like, or may include a photosensitive organic material, but is not limited thereto.

A first anode electrode ANO_1, a second anode electrode ANO_2, and a third anode electrode ANO_3 may be positioned on the third insulating layer 160 in the display area DA of the light emitting portion 100.

The first anode electrode ANO_1 may overlap the first emission area ELA_1, and at least a part thereof may extend to the non-emission area NELA. The first anode electrode ANO_1 may penetrate (or be disposed through) the third insulating layer 160 to be connected to the drain electrode D of the thin film transistor corresponding to the first anode electrode ANO_1.

The second anode electrode ANO_2 may overlap the second emission area ELA_2, and at least a part thereof may extend to the non-emission area NELA. The second anode electrode ANO_2 may penetrate the third insulating layer 160 to be connected to the drain electrode D of the thin film transistor corresponding to the second anode electrode ANO_2.

The third anode electrode ANO_3 may overlap the third emission area ELA_3, and at least a part thereof may extend to the non-emission area NELA. The third anode electrode ANO_3 may penetrate the third insulating layer 160 to be connected to the drain electrode D of the thin film transistor corresponding to the third anode electrode ANO_3.

In some embodiments, the first anode electrode ANO_1, the second anode electrode ANO_2, and the third anode electrode ANO_3 may be reflective electrodes, and in this case, the first anode electrode ANO_1, the second anode electrode ANO_2, and the third anode electrode ANO_3 may be a metal layer including a metal such as Ag, Mg, Al, Pt, Pd, Au, Ni, Nd, Ir, and Cr. In an alternative embodiment, the first anode electrode ANO_1, the second anode electrode ANO_2, and the third anode electrode ANO_3 may further include a metal oxide layer stacked on the metal layer. In an embodiment, the first anode electrode ANO_1, the second anode electrode ANO_2, and the third anode electrode ANO_3 may have a multilayer structure, e.g., a two-layer structure of ITO/Ag, Ag/ITO, ITO/Mg, or ITO/MgF, or a three-layer structure such as ITO/Ag/ITO.

The pixel defining layer 170 of the light emitting portion 100 may be disposed on the first anode electrode ANO_1, the second anode electrode ANO_2, and the third anode electrode ANO_3. The pixel defining layer 170 may define the first emission area ELA_1 with an opening defined therethrough to expose the first anode electrode ANO_1, define the second emission area ELA_2 with an opening defined therethrough to expose the second anode electrode ANO_2, and define the third emission area ELA_3 with an opening defined therethrough to expose the third anode electrode ANO_3. In such an embodiment, an area of the first anode electrode ANO_1, which is not covered by the pixel defining layer 170 and is exposed, may be the first emission area ELA_1, an area of the second anode electrode ANO_2, which is not covered by the pixel defining layer 170 and is exposed, may be the second emission area ELA_2, and an area of the third anode electrodes ANO_3, which is not covered by the pixel defining layer 170 and is exposed, may be the third emission area ELA_3. The area covered by the pixel defining layer 170 may be the non-emission area NELA.

The pixel defining layer 170 may overlap the light blocking area BA of the color filter member 320 to be described later in the third direction DR3. In addition, the pixel defining layer 170 may overlap the bank member BK, which will be described later, in the third direction DR3.

In some embodiments, the pixel defining layer 170 may include at least one organic insulating material selected from acrylic resin, epoxy resin, phenolic resin, polyamide resin, polyimide resin, unsaturated polyester resin, polyphenylene resin, polyphenylenesulfide resin and benzocyclobutene (BCB), but is not limited thereto.

The light emitting layer OL of the light emitting portion 100 may be disposed on the first anode electrode ANO_1, the second anode electrode ANO_2, and the third anode electrode ANO_3. In some embodiments, the light emitting layer OL may have a shape of a continuous film formed over the plurality of emission areas and the non-emission area NELA. In some embodiments, the light emitting layer OL may be positioned only in the display area DA, but is not limited thereto. In an embodiment, for example, a part of the light emitting layer OL may be further disposed in the non-display area NDA.

The cathode electrode CE of the light emitting portion 100 may be disposed on the light emitting layer OL. In some embodiments, the cathode electrode CE may be disposed on the light emitting layer OL to have a continuous film shape formed over the plurality of emission areas ELA_1, ELA_2, and ELA_3 and the non-emission area NELA. In other words, the cathode electrode CE may completely cover the light emitting layer OL.

The cathode electrode CE may have a semi-transmissive or transmissive property. In an embodiment, the cathode electrode CE may have a thickness of tens to hundreds of angstroms, such that the cathode electrode CE may have a semi-transmissive property. In some embodiments, where the cathode electrode CE has a semi-transmissive property, the cathode electrode CE may include Ag, Mg, Cu, Al, Pt, Pd, Au, Ni, Nd, Ir, Cr, Li, Ca, LiF/Ca, LiF/Al, Mo, Ti or a compound or mixture thereof, such as a mixture of Ag and Mg. In an embodiment, the cathode electrode CE may include a transparent conductive oxide to have a transmissive property. In some embodiments, where the cathode electrode CE has a transmissive property, the cathode electrode CE may include tungsten oxide (WxOx), titanium oxide ($TiO_2$), indium tin oxide (ITO), indium zinc oxide (IZO), zinc oxide (ZnO), indium tin zinc oxide (ITZO), magnesium oxide (MgO), or the like.

The first anode electrode ANO_1, the light emitting layer OL, and the cathode electrode CE may constitute (or collectively define) a first light emitting element including the first emission area ELA_1, the second anode electrode ANO_2, the light emitting layer OL, and the cathode electrode CE may constitute a second light emitting element including the second emission area ELA_2, and the third anode electrode ANO_3, the light emitting layer OL, and the cathode electrode CE may constitute a third light emitting element including the third emission area ELA_3. Each of the first light emitting element, the second light emitting element, and the third light emitting element may emit emission light.

The first capping layer CPL_1 may be disposed on the cathode electrode CE. The first capping layer CPL_1 may serve to improve viewing angle characteristics and increase external luminous efficiency. The first capping layer CPL_1 may be commonly disposed in the first emission area ELA_1, the second emission area ELA_2, the third emission area ELA_3, and the non-emission area NELA. The first capping layer CPL_1 may completely cover the cathode electrode CE.

The first capping layer CPL_1 may include at least one selected from an inorganic material having a light transmissive property and an organic material. In an embodiment, the first capping layer CPL_1 may be constituted with an inorganic layer, or constituted with an organic layer TFEb, or may be constituted with the organic layer TFEb including inorganic particles. In some embodiments, the first capping layer CPL_1 may include a triamine derivative, a carbazole biphenyl derivative, an arylenediamine derivative, an aluminum quinolium complex (Alq3), or the like, but is not limited thereto.

The thin film encapsulation layer of the light emitting portion 100 may be disposed on the first capping layer CPL_1. The thin film encapsulation layer may serve to protect elements or components positioned thereunder from external foreign matter such as moisture. The thin film encapsulation layer is commonly disposed in the first emission area ELA_1, the second emission area ELA_2, the third emission area ELA_3, and the non-emission area NELA. The thin film encapsulation layer may completely cover the first capping layer CPL_1.

The thin film encapsulation layer may include a lower inorganic layer TFEa, the organic layer TFEb, and an upper inorganic layer TFEc sequentially stacked on the first capping layer CPL_1.

The lower inorganic layer TFEa may completely cover the first capping layer CPL_1 in the display area DA to cover the first light emitting element, the second light emitting element, and the third light emitting element.

The organic layer TFEb may be disposed on the lower inorganic layer TFEa to cover the first light emitting element, the second light emitting element, and the third light emitting element.

The upper inorganic layer TFEc may be disposed on the organic layer TFEb to completely cover the organic layer TFEb.

In some embodiments, each of the lower inorganic layer TFEa and the upper inorganic layer TFEc may include or be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like, but is not limited thereto.

In some embodiments, the organic layer TFEb may include or be formed of acrylic resin, methacrylic resin, polyisoprene, vinyl resin, epoxy resin, urethane resin, cellulose resin, perylene resin or the like, but is not limited thereto.

The light transmitting portion 300 may have a structure in which a second substrate 310, the color filter member 320, a second capping layer CPL_2, the bank member BK, the light transmitting member, and a third capping layer CPL_3 are sequentially stacked in the third direction DR3.

The second substrate 310 of the light transmitting portion 300 may serve as a base of the light transmitting portion 300. The second substrate 310 may include or be made of a light transmitting material. The second substrate 310 may be a glass substrate or a plastic substrate. In an embodiment where the second substrate 310 is a plastic substrate, the second substrate 310 may have flexibility. In some embodiments, where the second substrate 310 is a plastic substrate, the second substrate 310 may include polyimide, but is not limited thereto. As described above, since the light emitting portion 100 and the light transmitting portion 300 face each other in the third direction DR3, the first substrate 110 of the light emitting portion 100 and the second substrate 310 of the light transmitting portion 300 may face each other in the third direction DR3.

The color filter member 320 of the light transmitting portion 300 may be disposed on the other side of the second substrate 310 in the third direction DR3, that is, between the second substrate 310 and the light emitting portion 100. The color filter member 320 may include a filtering pattern area and a light blocking pattern portion BM. The light blocking pattern portion BM may surround the filtering pattern area.

The filtering pattern of the color filter member 320 may define a transmission area (e.g., the first to third transmission areas TA_1 To TA_3) of the light transmitting portion 300, and the light blocking pattern portion BM may define the light blocking area BA of the light transmitting portion 300.

The color filter member 320 may include a first color filter 320_1, a second color filter 320_2, and a third color filter 320_3. The first color filter 320_1 may absorb both the second light and the third light except the first light, the second color filter 320_2 may absorb both the first light and the third light except the second light, and the third color filter 320_3 may absorb both the first light and the second light except the third light. In other words, the first color filter 320_1 may transmit the first light, the second color filter 320_2 may transmit the second light, and the third color filter 320_3 may transmit the third light.

In some embodiments, the first color filter 320_1 may be a blue color filter and may include a blue colorant. In the disclosure, the colorant is a concept including both a dye and a pigment. The first color filter 320_1 may include a base resin and a blue colorant may be dispersed in the base resin. In some embodiments, the second color filter 320_2 may be a green color filter and may include a green colorant. The second color filter 320_2 may include a base resin, and a green colorant may be dispersed in the base resin. In some embodiments, the third color filter 320_3 may be a red color filter and may include a red colorant. The third color filter 320_3 may include a base resin, and a red colorant may be dispersed in the base resin.

The first color filter 320_1 may include a first filtering pattern area 320_1a and a first blocking pattern area 320_1b surrounding the first filtering pattern area 320_1a, the second color filter 320_2 may include a second filtering pattern area 320_2a and a second blocking pattern area 320_2b surrounding the second filtering pattern area 320_2a, and the third color filter 320_3 may include a third filtering pattern area 320_3a and a third light blocking pattern area 320_3b surrounding the third filtering pattern area 320_3a. In an embodiment, the first filtering pattern area 320_1a of the first color filter 320_1 may overlap the first transmission area TA_1, and the first blocking pattern area 320_1b of the first color filter 320_1 may surround the first filtering pattern area 320_1a overlapping the first transmission area TA_1, however may not overlap the second transmission area TA_2 and the third transmission area TA_3, and may overlap the light blocking area BA. The second filtering pattern area 320_2a of the second color filter 320_2 may overlap the second transmission area TA_2, and the second blocking pattern area 320_2b of the second color filter 320_2 may surround the second filtering pattern area 320_2a overlapping the second transmission area TA_2, however may not overlap the first transmission area TA_1 and the third transmission area TA_3, and may overlap the light blocking area BA. The third filtering pattern area 320_3a of the third color filter 320_3 may overlap the third transmission area TA_3, and the third blocking pattern area 320_3b of the third color filter 320_3 may surround the third filtering pattern area 320_3a overlapping the third transmission area TA_3, however may not overlap the first transmission area TA_1 and the second transmission area TA_2, and may overlap the light blocking area BA. In such an embodiment, the filtering pattern area of the color filter member 320 may include the first filtering pattern area 320_1a of the first color filter 320_1, the second filtering pattern area 320_2a of the second color filter 320_2, and the third filtering pattern area 320_3a of the third color filter 320_3, and the light blocking pattern portion BM may have a structure in which the first light blocking pattern area 320_1b of the first color filter 320_1, the second light blocking pattern area 320_2b of the second color filter 320_2, and the third light blocking pattern area 320_3b of the third color filter 320_3 are stacked.

The first filtering pattern area 320_1a of the first color filter 320_1 may function as a blocking filter that blocks red light and green light. In an embodiment, the first filtering pattern area 320_1a may selectively transmit the first light (e.g., blue light) and block or absorb the second light (e.g., green light) and the third color light (e.g., red light).

The second filtering pattern area 320_2a of the second color filter 320_2 may function as a blocking filter that blocks blue light and red light. In an embodiment, the second filtering pattern area 320_2a may selectively transmit the second light (e.g., green light) and block or absorb the first light (e.g., blue light) and the third light (e.g., red light).

The third filtering pattern area 320_3a of the third color filter 320_3 may function as a blocking filter that blocks blue light and green light. In an embodiment, the third filtering pattern area 320_3a may selectively transmit the third light (e.g., red light) and block or absorb the first light (e.g., blue light) and the second light (e.g., green light).

In some embodiments, the light blocking pattern portion BM has a structure in which the first blocking pattern area 320_1b, the third blocking pattern area 320_3b, and the second blocking pattern area 320_2b are sequentially stacked in the third direction DR3, but the disclosure is not limited thereto. In an alternative embodiment, for example, the light blocking pattern portion BM may not be constituted with the color filters 320_1, 320_2, and 320_3 described above, but may be formed as a separate organic light blocking material through coating and exposure processes of the organic light blocking material, and the like. Hereinafter, for simplicity of description, description will be made focusing on embodiments where the light blocking pattern has a structure in which the first blocking pattern area 320_1b, the third blocking pattern area 320_3b, and the second blocking pattern area 320_2b are sequentially stacked in the third direction DR3. The light blocking pattern portion BM may absorb all of the first light, the second light, and the third light through the above-described configuration.

The second capping layer CPL_2 of the light transmitting portion 300 may be disposed on one surface of the color filter member 320 to cover the color filter member 320. The second capping layer CPL_2 may prevent impurities such as moisture or air from penetrating into the color filter member 320 to damage or contaminate the light blocking pattern portion BM, that is, the filtering pattern area of the color filter member 320.

The second capping layer CPL_2 may include an inorganic material. In some embodiments, the second capping layer CPL_2 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like, but is not limited thereto.

The bank member BK of the light transmitting portion 300 may be disposed on the other side surface of the second capping layer CPL_2 in the third direction DR3 as shown in FIG. 5, and may be disposed to be spaced apart in the second direction DR2 to form a space for accommodating the light transmitting member, which will be described later. That is, the bank member BK may serve to partition a space in which a light transmitting member, which will be described later, is disposed. The bank member BK may be directly in contact with the other side surface of the second capping layer CPL_2 in the third direction DR3. The bank member BK may surround a light transmitting member to be described later in a plan view. The bank member BK may be disposed to overlap the non-emission area NELA of the light emitting portion 100 and the light blocking area BA of the light transmitting portion 300. The bank member BK may not overlap the emission areas ELA_1, ELA_2, and ELA_3 of the light emitting portion 100 and the transmission areas TA_1, TA_2, and TA_3 of the light transmitting portion 300.

In some embodiments, the bank member BK may include an organic material having photocurability or an organic material having photocurability and including a light blocking material, but is not limited thereto.

The light transmitting member of the light transmitting portion 300 may be disposed on the other side surface of the second capping layer CPL_2 in the third direction DR3 exposed by the separation space of the bank member BK. The light transmitting member may include a first light transmitting member 330 overlapping the first transmission area TA_1, a second light transmitting member 340 overlapping the second transmission area TA_2, and a third light transmitting member 350 overlapping the third transmission area TA_3. The first light transmitting member 330, the second light transmitting member 340, and the third light transmitting member 350 may be disposed in the display area DA of the light transmitting portion 300.

The first light transmitting member 330 may be disposed in a space partitioned by the bank member BK, and may overlap the first emission area ELA_1 and the first transmission area TA_1 in the third direction DR3. The first light transmitting member 330 may be directly in contact with the second capping layer CPL_2 and the bank member BK.

The first light transmitting member 330 may be a light transmission pattern that transmits incident light. In an embodiment, as described above, the emission light provided from the first light emitting element may pass through the first light transmitting member 330 and the first filtering pattern area 320_1a of the first color filter 320_1 as blue light, and may be emitted to the outside of the display device 1. In such an embodiment, the first emission light L1 passing through the first transmission area TA_1 in the first emission area ELA_1 and emitted to the outside may be blue light.

A first base resin 330a may include or be made of an organic material having high light transmittance. In some embodiments, the first base resin 330a may include an organic material such as epoxy resin, acrylic resin, cardo resin, or imide resin, but is not limited thereto.

A first light scatterer 330b may have a refractive index different from that of the first base resin 330a and form an optical interface with the first base resin 330a. The first light scatterer 330b may be a light scattering particle. The first light scatterer 330b may scatter light in a random direction irrespective of the incident direction of incident light, without substantially converting the wavelength of the light passing through the first transmission area TA_1.

The first light scatterer 330b may be a material that scatters at least a part of transmitted light, and may include metal oxide particles or organic particles. In some embodiments, the first light scatterer 330b may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like as a metal oxide, and may include an acrylic resin or a urethane-based resin, or the like as organic particles, but is not limited thereto.

The second light transmitting member 340 may be disposed in a space partitioned by the bank member BK, and may overlap the second emission area ELA_2 and the second transmission area TA_2 in the third direction DR3.

The second light transmitting member 340 may be directly in contact with the second capping layer CPL_2 and the bank member BK.

The second light transmitting member 340 may be a wavelength conversion pattern that converts or shifts the peak wavelength of incident light into light of another specific peak wavelength to emit the light. In an embodiment, as described above, the emission light provided from the second light emitting element may pass through the second light transmitting member 340 and the second filtering pattern area 320_2a of the second color filter 320_2 as blue light, be converted into green light having a peak wavelength in a range of 510 nm to about 550 nm, and be emitted to the outside of the display device 1. In such an embodiment, the second emission light L2 passing through the second transmission area TA_2 in the second emission area ELA_2 and emitted to the outside may be green light.

The second light transmitting member 340 may include a second base resin 340a, a second light scatterer 340b dispersedly disposed in the second base resin 340a, and a first wavelength shifter 340c dispersedly disposed in the second base resin 340a. The features of the second base resin 340a are substantially the same as or similar to the first base resin 330a of the first light transmitting member 330 described above, and the second light scatterer are substantially the same as or similar to the first light scatterer 330b of the first light transmitting member 330 described, so any repetitive detailed description thereof will be omitted hereinafter, and the first wavelength shifter 340c will be mainly described.

The first wavelength shifter 340c may convert or shift the peak wavelength of incident light to another specific peak wavelength. The first wavelength shifter 340c may convert the emission light, which is the blue light provided by the second light emitting element, into red light having a single peak wavelength in a range of 510 nm to about 550 nm and emit the red light.

In some embodiments, the first wavelength shifter 340c may be a quantum dot, a quantum rod, or a fluorescent substance, but is not limited thereto. Hereinafter, for simplicity of description, embodiments where the first wavelength shifter 340c is a quantum dot will be mainly described. The quantum dot may be a particulate material that emits light of a specific color when an electron transitions from a conduction band to a valence band. The quantum dot may be a semiconductor nanocrystal material. The quantum dot may have a specific band gap according to its composition and size. Thus, the quantum dot may absorb light and then emit light having an intrinsic wavelength. Examples of semiconductor nanocrystal of quantum dots may include group IV nanocrystal, group II-VI compound nanocrystal, group III-V compound nanocrystal, group IV-VI nanocrystal, a combination thereof, or the like.

The group II-VI compound may be selected from binary compounds, ternary compounds, and quaternary compounds, where the binary compounds are selected from CdSe, CdTe, ZnS, ZnSe, ZnTe, ZnO, HgS, HgSe, HgTe, MgSe, MgS and mixtures thereof, the ternary compounds are selected from InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof, and the quaternary compounds are selected from HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-V compound may be selected from binary compounds, ternary compounds, and quaternary compounds, where the binary compounds are selected from GaN, GaP, GaAs, GaSb, AlN, AlP, AlAs, AlSb, InN, InP, InAs, InSb and mixtures thereof, the ternary compounds are selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures thereof, and the quaternary compounds are selected from GaAlNAs, GaAl-NSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group IV-VI compound may be selected from binary compounds, ternary compounds, and quaternary compounds, where the binary compounds are selected from SnS, SnSe, SnTe, PbS, PbSe, PbTe and mixtures thereof, the ternary compounds are selected from SnSeS, SnSeTe, SnSTe, PbSeS, PbSeTe, PbSTe, SnPbS, SnPbSe, SnPbTe and mixtures thereof, and the quaternary compounds are selected from SnPbSSe, SnPbSeTe, SnPbSTe and mixtures thereof. The group IV element may be selected from Si, Ge and mixtures thereof. The group IV compound may be a binary compound selected from SiC, SiGe and mixtures thereof.

In this case, the binary compound, the tertiary compound or the quaternary compound may exist in particles at a uniform concentration, or may exist in the same particle divided into states where concentration distributions are partially different. Further, the particles may have a core/shell structure in which one quantum dot surrounds another quantum dot. An interface between the core and the shell may have a concentration gradient in which the concentration of elements present in the shell decreases toward the center.

In some embodiments, the quantum dot may have a core-shell structure including a core including the nanocrystal described above and a shell surrounding the core. The shell of the quantum dot may act as a protective layer for maintaining semiconductor characteristics by preventing chemical denaturation of the core and/or as a charging layer for giving electrophoretic characteristics to the quantum dot. The shell may be formed of a single layer or multiple layers. An interface between the core and the shell may have a concentration gradient in which the concentration of elements present in the shell decreases toward the center. Examples of the shell of the quantum dot may include a metal or non-metal oxide, a semiconductor compound, and a combination thereof.

In an embodiment, for example, the metallic or nonmetallic oxide may include, but is not limited to, a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ and $NiO$, or a tertiary compound such as $MgAl_2O_4$, $CoFe_2O_4$, $NiFe_2O_4$ and $CoMn_2O_4$.

In addition, the semiconductor compound may include, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

The light emitted from the first wavelength shifter 340c may have a full width of half maximum (FWHM) of the emission wavelength spectrum, which is about 45 nm or less, about 40 nm or less, or about 30 nm or less. Thus, the purity and reproducibility of colors displayed by the display device 1 can be further improved. In addition, the light emitted from the first wavelength shifter 340c may be emitted in various directions regardless of the incident direction of incident light. Accordingly, side visibility of the second color displayed in the second transmission area TA_2 may be improved.

Some of the emission light provided from the second light emitting element may pass through the second light transmitting member 340 and be emitted without being converted into green light by the first wavelength shifter 340c. A component of the emission light, of which the wavelength is not converted by the second light transmitting member 340, which is incident to the second filtering pattern area 320_2a of the second color filter 320_2 may be blocked by the second filtering pattern area 320_2a. On the other hand, the green light converted by the second light transmitting member 340 among the emission light passes through the second filtering pattern area 320_2a and is emitted to the outside. That is, the second emission light L2 emitted to the outside of the display device 1 through the second transmission area TA_2 may be green light.

The third light transmitting member 350 may be disposed in a space partitioned by the bank member BK, and may overlap the third emission area ELA_3 and the third transmission area TA_3 in the third direction DR3. The third light transmitting member 350 may be directly in contact with the second capping layer CPL_2 and the bank member BK.

The third light transmitting member 350 may be a wavelength conversion pattern that converts or shifts the peak wavelength of incident light into light of another specific peak wavelength to emit the light. In an embodiment, as described above, the emission light provided from the second light emitting element may pass through the second light transmitting member 340 and the second filtering pattern area 320_2a of the second color filter 320_2 as blue light, be converted into red light having a peak wavelength in a range of about 610 nm to about 650 nm, and be emitted to the outside of the display device 1. In other words, the third emission light L3 that passes through the third transmission area TA_3 in the third emission area ELA_3 and emitted to the outside may be red light.

The third light transmitting member 350 may be a wavelength conversion pattern that converts or shifts the peak wavelength of incident light into light of another specific peak wavelength to emit the light. In an embodiment, as described above, the emission light provided from the third light emitting element may pass through the third light transmitting member 350 and the third filtering pattern area 320_3a of the second third color filter 320_3 as blue light, be converted into red light having a peak wavelength in a range of about 610 nm to about 650 nm, and be emitted to the outside of the display device 1. In other words, the third emission light L3 that passes through the third transmission area TA_3 in the third emission area ELA_3 and emitted to the outside may be red light.

The third light transmitting member 350 may include a third base resin 350a, a third light scatterer 350b dispersedly disposed in the third base resin 350a, and a second wavelength shifter 350c dispersedly disposed in the third base resin 350a. The features of the third base resin 350a are substantially the same as or similar to the features of the first base resin 330a of the first light transmitting member 330, the features of the third light scatterer are substantially the same as or similar to the features of the first light scatterer 330b of the first light transmitting member 330, and the features of the second wavelength shifter 350c are substantially the same as or similar to the features of the first wavelength shifter 340c of the second light transmitting member 340, so that hereinafter, any repetitive detailed descriptions of the third base resin 350a, the third light scatterer 350 b, and the second wavelength shifter 350c will be omitted.

Some of the emission light provided from the third light emitting element may pass through the third light transmitting member 350 and be emitted without being converted into red light by the second wavelength shifter 350*c*. A component of the emission light, of which the wavelength is not converted by the third light transmitting member 350 and which is incident to the third filtering pattern area 320_3*a* of the third color filter 320_3 may be blocked by the third filtering pattern area 320_3*a*. On the other hand, the red light converted by the third light transmitting member 350 among the emission light passes through the third filtering pattern area 320_3*a* and is emitted to the outside. That is, the third emission light L3 emitted to the outside of the display device 1 through the third transmission area TA_3 may be red light.

The third capping layer CPL_3 of the light transmitting portion 300 is disposed on the bank member BK, the first light transmitting member 330, the second light transmitting member 340, and the third light transmitting member 350, and thus may serve to prevent impurities such as moisture or air from the outside from penetrating and damaging or contaminating the first light transmitting member 330, the second light transmitting member 340, and the third light transmitting member 350. The third capping layer CPL_3 may cover the first light transmitting member 330, the second light transmitting member 340, and the third light transmitting member 350.

The third capping layer CPL_3 may include or be made of an inorganic material. In some embodiments, the third capping layer CPL_3 may be made of a same material as the second capping layer CPL_2 or may include at least one selected from the materials mentioned in the description of the second capping layer CPL_2, but is not limited thereto.

In an embodiment, as described above, the filling portion 500 may be interposed between the light emitting portion 100 and the light transmitting portion 300 to fill the space between the light emitting portion 100 and the light transmitting portion 300. In some embodiments, the filling portion 500 may be in direct contact with the upper inorganic layer TFEc of the thin film encapsulation layer of the light emitting portion 100 and the third capping layer CPL_3 of the light transmitting portion 300, but the disclosure is not limited thereto.

In some embodiments, the filling portion 500 may include or be made of a material having an extinction coefficient of substantially zero. There is a correlation between a refractive index and an extinction coefficient, and as the refractive index decreases, the extinction coefficient also decreases. In addition, when the refractive index is 1.7 or less, the extinction coefficient may substantially converge to zero. In some embodiments, the filling portion 500 may include or be made of a material having a refractive index of 1.7 or less, such that it is possible to prevent or minimize light provided from the self-light emitting element from being absorbed while passing through the filling portion 500. In some embodiments, the filling portion 500 may include or be made of an organic material having a refractive index of 1.4 to 1.6.

Figure 6:
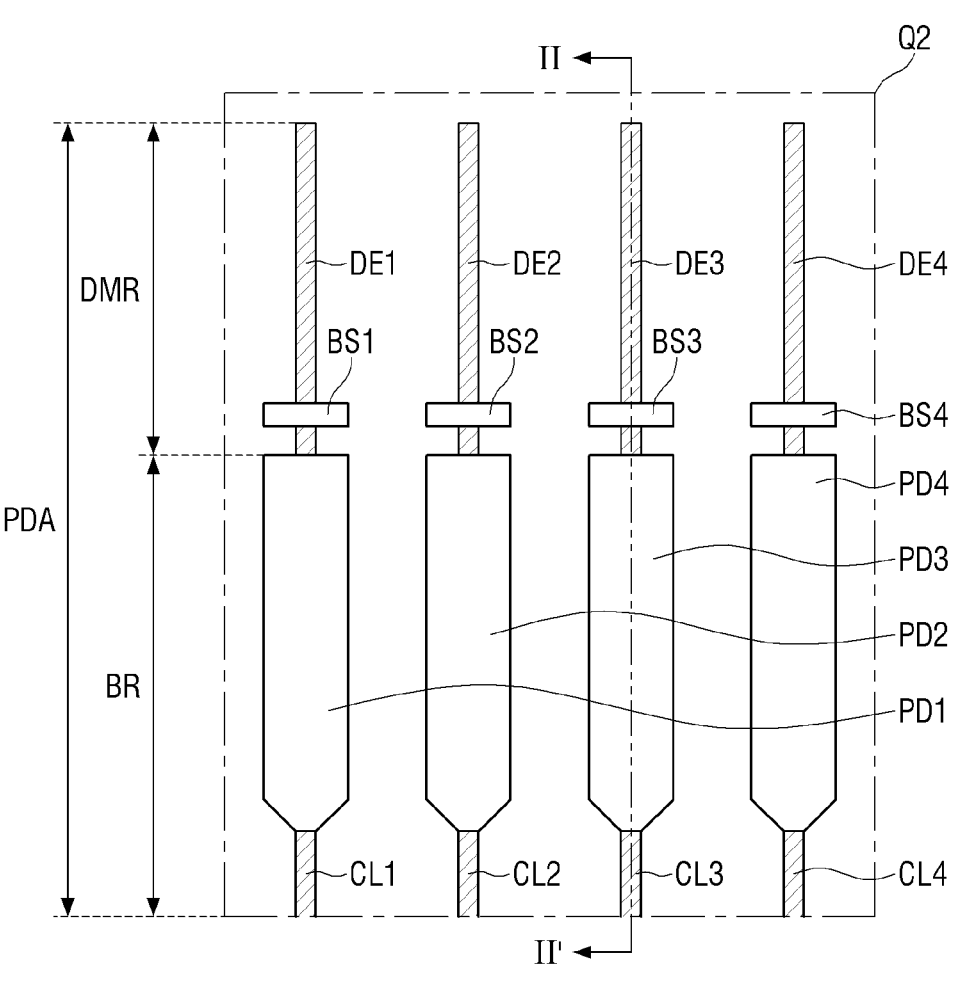
FIG. 6 is an enlarged plan view of portion Q2 of FIG. 1, and more specifically, is a schematic plan view of a pad portion of FIG. 1.
Figure 6:
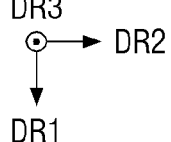

FIG. 6 is an enlarged plan view of portion Q2 of FIG. 1, and more specifically, is a schematic plan view of a pad portion of FIG. 1.

Referring to FIG. 6, the pad area PDA may include a bonding area BR in which the plurality of pads PD and a plurality of connection lines CL are disposed, and a dummy area DMR in which a plurality of peeling prevention structures BS and a plurality of dummy lines DE are disposed.

The dummy area DMR may be an area in which a peeling prevention structure BS for preventing peeling that may occur in a process of detaching a flexible circuit board that is determined to be defective and the dummy line DE that is a floating line are disposed.

In an embodiment, the plurality of pads PD in the pad area PDA may be disposed to be spaced apart from each other along the second direction DR2 from the edge of the first substrate 110. Although FIG. 6 an embodiment where the plurality of pads PD form (or is arranged in) a single row, but is not limited thereto. In some embodiments, the plurality of pads PD may be disposed to form a plurality of rows. Hereinafter, embodiments where the plurality of pads PD form a single row will be described in detail.

The plurality of connection lines CL may be connected to the plurality of pads PD to extend toward the display area DA, respectively. That is, a first connection line CL1 may be connected to one side of a first pad PD1, a second connection line CL2 may be connected to one side of a second pad PD2, a third connection line CL3 may be connected to one side of a third pad PD3, and a fourth connection line CL4 may be connected to one side of a fourth pad PD4, while extending toward the display area DA.

In an embodiment, as described above, the plurality of connection lines CL may be connected to the plurality of pads PD to transmit various driving signals received from the outside by the pads PD. In an embodiment, for example, the connection line CL may be connected to a gate line or a data line positioned in the display area DA or the non-display area NDA. However, the disclosure is not limited thereto, and the connection line CL may be connected to other lines such as a voltage line positioned in the display area DA or the non-display area NDA.

The plurality of peeling prevention structures BS may be spaced apart from the plurality of pads PD and disposed on the other side of the plurality of pads PD. In an embodiment, for example, a first peeling prevention structure BS1 may be disposed on the other side of the first pad PD1 at a predetermined interval from the first pad PD1, and one side surface of the first peeling prevention structure BS may face the end of the pad PD1.

In such an embodiment, the plurality of first to fourth peeling prevention structures BS1, BS2, BS3, BS4 may be arranged in a row along the second direction DR2 in an island shape in a plan view. FIG. 6 illustrates an embodiment where the plurality of first to fourth peeling prevention structures BS1, BS2, BS3, BS4 form a single row and are arranged along the second direction DR2, but the disclosure is not limited thereto. In some embodiments, the plurality of peeling prevention structures BS may form a plurality of rows and may be arranged in an island shape along the second direction DR2. In alternative embodiments, the peeling prevention structure BS may extend along the second direction DR2 and be disposed in a line shape in a plan view.

The plurality of first to fourth dummy lines DE1, DE2, DE3, DE4 may be connected to the other side of the plurality of pads PD to extend along the first direction DR1.

In an embodiment, the plurality of dummy lines DE may be disposed in (or directly on) a different layer from the plurality of pads PD and the plurality of peeling prevention structures BS, and may be connected to the other side of the plurality of pads PD to extend toward the end of the first substrate 110. In an embodiment, for example, the first dummy line DE may be disposed in a different layer from the first pad PD and the first peeling prevention structure BS1, and may be connected to the first pad PD and the first peeling prevention structure BS1.

In an embodiment, the plurality of dummy lines DE may be disposed to be spaced apart from each other along the second direction DR2 and may extend along the first direction DR1, similarly to the plurality of pads PD and the plurality of peeling prevention structures BS.

The dummy line DE may be a floating line rather than a separate line. In an embodiment, the dummy line DE may be a part of an inspection line for detecting a short circuit or disconnection defect between the gate line, the data line, and each pixel by applying an inspection signal to each of the gate line and the data line.

That is, after the defect inspection of the display device 1 is finished, the dummy line DE may be a part of the remaining inspection line after the inspection line and a part of an inspection pad electrode (not illustrated) connected to the end of the inspection line are cut in the process of cutting the first substrate 110. However, the disclosure is not limited thereto, and the dummy line DE may be a part of the remaining floating line after performing another role in the manufacturing process of the display device 1.

Hereinafter, a detailed stacked structure of the pad area PDA of the display device will be described in detail.

Figure 7:
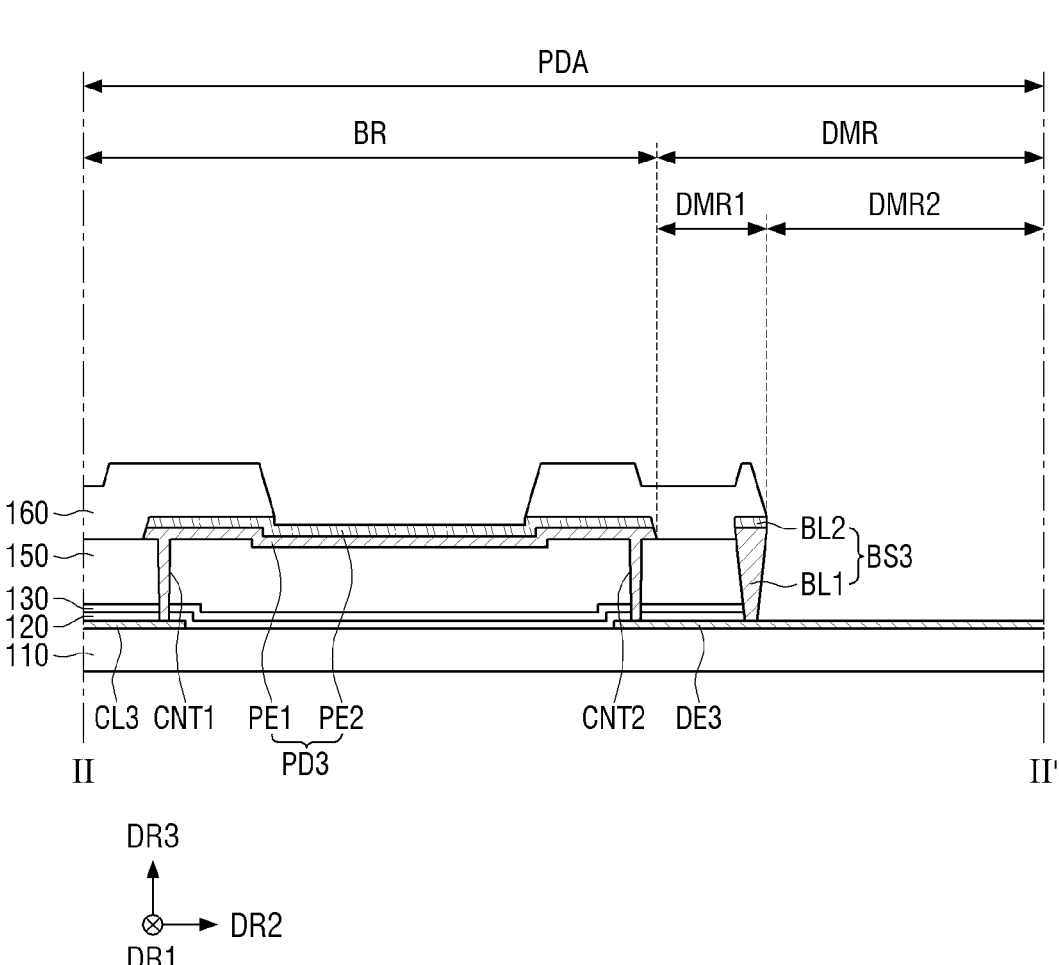
FIG. 7 is a cross-sectional view schematically illustrating a cross section taken along line II-II' of FIG. 6.

FIG. 7 is a cross-sectional view schematically illustrating a cross section taken along line II-II' of FIG. 6. More specifically, FIG. 7 is a cross-sectional view exemplarily illustrating a cross section of the pad area PDA including the third pad PD3 among the plurality of pads PD disposed in the pad area PDA according to an embodiment illustrated in FIG. 6.

Referring to FIG. 7, the pad area PDA including the third pad PD3 may have a structure in which the first substrate 110, the third connection line CL3 and the third dummy line DE3, the buffer layer 120, the first insulating layer 130, the second insulating layer 150, the third pad PD3 and a third peeling prevention structure BS3, and the third insulating layer 160 are sequentially stacked on in the third direction DR3.

The first substrate 110, the buffer layer 120, the first insulating layer 130, the second insulating layer 150, and the third insulating layer 160 are substantially the same as the first substrate 110, the buffer layer 120, the first insulating layer 130, the second insulating layer 150, and the third insulating layer 160 disposed on the light emitting portion 100 described above, and thus the differences will be mainly described.

In an embodiment, as described above, the pad area PDA may include the bonding area BR and the dummy area DMR, and the dummy area DMR includes a first dummy area DMR1 and a second dummy area DMR2. Specifically, as illustrated in FIG. 7, the bonding area BR refers to an area from one side of the third connection line CL3 to the end of the third pad PD3, the first dummy area DMR1 refers to an area from the end of the third pad PD3 to the end of the third peeling prevention structure BS3, and the second dummy area DMR2 refers to an area from the end of the third peeling prevention structure BS3 to the end of the first substrate 110.

The third connection line CL3 and the third dummy line DE3 may be disposed on the first substrate 110.

The third connection line CL3 and the third dummy line DE3 are disposed to be spaced apart from each other in the second direction DR2. That is, the third connection line CL3 may be disposed on one side of the bonding area BR, and the third dummy line DE3 may be disposed and extended on the first substrate 110 positioned in the dummy area DMR along the second direction DR2.

The third connection line CL and the third dummy line DE3 may include a same material as the lower metal layer BML (see FIG. 5), and may be formed by a same process as the lower metal layer BML.

The buffer layer 120 may be disposed on the third connection line CL3 and the third dummy line DE3 in the bonding area BR and the first dummy area DMR1, and may expose the top surface of the third dummy line DE3 positioned on the second dummy area DMR2. That is, the buffer layer 120 may not be disposed in the second dummy area DMR2.

The buffer layer 120 may cover all of the third connection line CL3 positioned in the bonding area BR and the third dummy line DE3 positioned in the first dummy area DMR1, and may cover the exposed top surface of the first substrate 110 due to the third connection line CL3 and the third dummy line DE3 being spaced apart from each other. That is, the buffer layer 120 may conformally reflect the third connection line CL3 and the third dummy line DE3 positioned in the first dummy area DMR1. In such an embodiment, the buffer layer 120 may reflect a height difference between the third connection line CL3 and the third dummy line DE3.

The first insulating layer 130 and the second insulating layer 150 may be sequentially disposed on the buffer layer 120. That is, the first insulating layer 130 and the second insulating layer 150 may be disposed in the bonding area BR and the first dummy area DMR1, but may not be disposed in the second dummy area DMR2.

The third pad PD3 and the third peeling prevention structure BS3 may be disposed on the second insulating layer 150.

In an embodiment, the third pad PD3 may include a first pad electrode PE1 disposed on the second insulating layer 150 and a second pad electrode PE2 disposed on the first pad electrode PE1.

The first pad electrode PE1 may be connected to the third connection line CL3 through a first contact hole CNT1 defined through the buffer layer 120, the first insulating layer 130, and the second insulating layer 150, and may be connected to the third dummy line DE3 through a second contact hole CNT2 defined through the buffer layer 120, the first insulating layer 130, and the second insulating layer 150.

The first pad electrode PE1 of the third pad PD3 may include a same material as the source electrode S and the drain electrode D described above, and may be formed by a same process as the source electrode S and the drain electrode D. The second pad electrode PE2 of the third pad PD3 may include a metal oxide such as ITO, IZO, ITZO, or In$_2$O$_3$. In an embodiment, for example, the second pad electrode PE2 may include ITO. In an embodiment, since the third pad PD3 is directly exposed to external oxygen, the third pad PD3 may include a metal oxide to protect the first pad electrode PE1 positioned below.

The third peeling prevention structure BS3 may include one side surface facing the end of the third pad PD3 and the other side surface opposite to the one side surface. The third peeling prevention structure BS3 may have a reverse taper shape. That is, the cross-sectional shape of the third peeling prevention structure BS3 may include inversely tapered inclined surfaces at both sidewalls in the third direction DR3. In such an embodiment, the third peeling prevention structure BS3 may have a shape in which the horizontal width of the upper area is greater than the horizontal width of the lower area. However, the disclosure is not limited thereto, and in some embodiments, both side surfaces of the third peeling prevention structure BS3 may include a normal taper inclined surface or a curved inclined portion.

The third peeling prevention structure BS3 may include a first peeling prevention structure layer BL1 and a second peeling prevention structure layer BL2. One side surface of the first peeling prevention structure layer BL1 facing the third pad PD3 may be in contact with the buffer layer 120, the first insulating layer 130, the second insulating layer 150, and the third gate insulating layer 160 to be described later, and the other side surface of the first peeling prevention structure layer BL1 that does not face the third pad PD3 may be exposed.

In addition, a top surface of the first peeling prevention structure layer BL1 may be higher than a top surface of the second insulating layer 150 positioned in the bonding area BR and the first dummy area DMR1, and may be positioned at a same position (or height or level) as a top surface of the first pad electrode PE1 of the third pad PD3. A bottom surface of the first peeling prevention structure layer BL1 may be directly in contact with the third dummy line DE3.

The second peeling prevention structure layer BL2 may be disposed on the first peeling prevention structure layer BL1. One side surface of the second peeling prevention structure layer BL2 facing the third pad PD3 and the top surface of the second peeling prevention structure layer BL2 may be in contact with the third insulating layer 160 to be described later, and the other side surface of the second peeling prevention structure layer BL2 that does not face the third pad PD3 may be exposed to the outside.

The first peeling prevention structure layer BL1 of the third peeling prevention structure BS3 may include a same material as the first pad electrode PE1 of the third pad PD3 and be formed by a same process as the first pad electrode PE1 of the third pad PD3, and the second peeling prevention structure layer BL2 of the third peeling prevention structure BS3 may include a same material as the second pad electrode PE2 of the third pad PD3 and be formed by a same process as the second pad electrode PE2 of the third pad PD3.

The third gate insulating layer 160 may be disposed on the third pad PD3 and the third peeling prevention structure BS3 in the bonding area BR and the first dummy area DMR1, respectively. The third insulating layer 160 may expose a central portion of the third pad PD3 on the third pad PD3. In an embodiment, the second insulating layer 160 may expose a central portion of the second pad electrode PE2 on the third pad PD3.

The third insulating layer 160 may be in contact with the top surface of the second insulating layer 150 exposed by the third pad PD3 and the third peeling prevention structure BS3, and may be disposed on the top surface of the third peeling prevention structure BS3. In an embodiment, the end of the third insulating layer 160 may be disposed to be aligned with the boundary of the top surface of the first peeling prevention structure layer BL1 of the third peeling prevention structure BS3. In such an embodiment, the third insulating layer 160 may expose the other side surface of the third peeling prevention structure BS3. However, the disclosure is not limited thereto, and in some embodiments, the end of the third insulating layer 160 may further extend from the boundary of the top surface of the third peeling prevention structure BS3 to cover the upper area of the other side surface of the third peeling prevention structure BS3.

Accordingly, the buffer layer 120, the first insulating layer 130, the second insulating layer 150, and the third insulating layer 160 are not disposed in the second dummy area DMR2, so that the other side surface of the third peeling preventing structure BS3 and the top surface of the third dummy line DE3 connected to the third pad PD3 and the third peeling preventing structure BS3 and extending toward the end of the first substrate 110 may be exposed.

Figure 8:
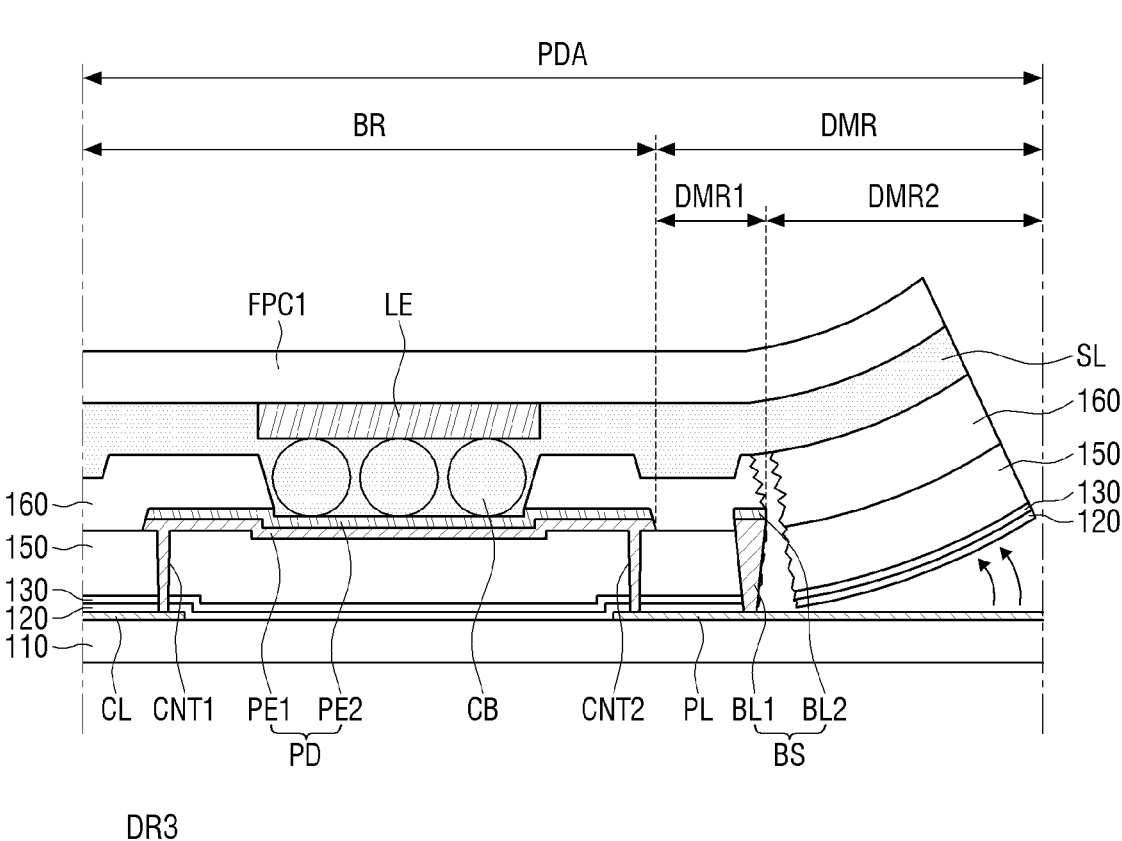
FIG. 8 is a cross-sectional view illustrating a state in which a flexible circuit board is being separated from a pad area according to an embodiment.
Figure 8:
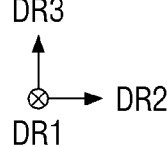
Figure 9:
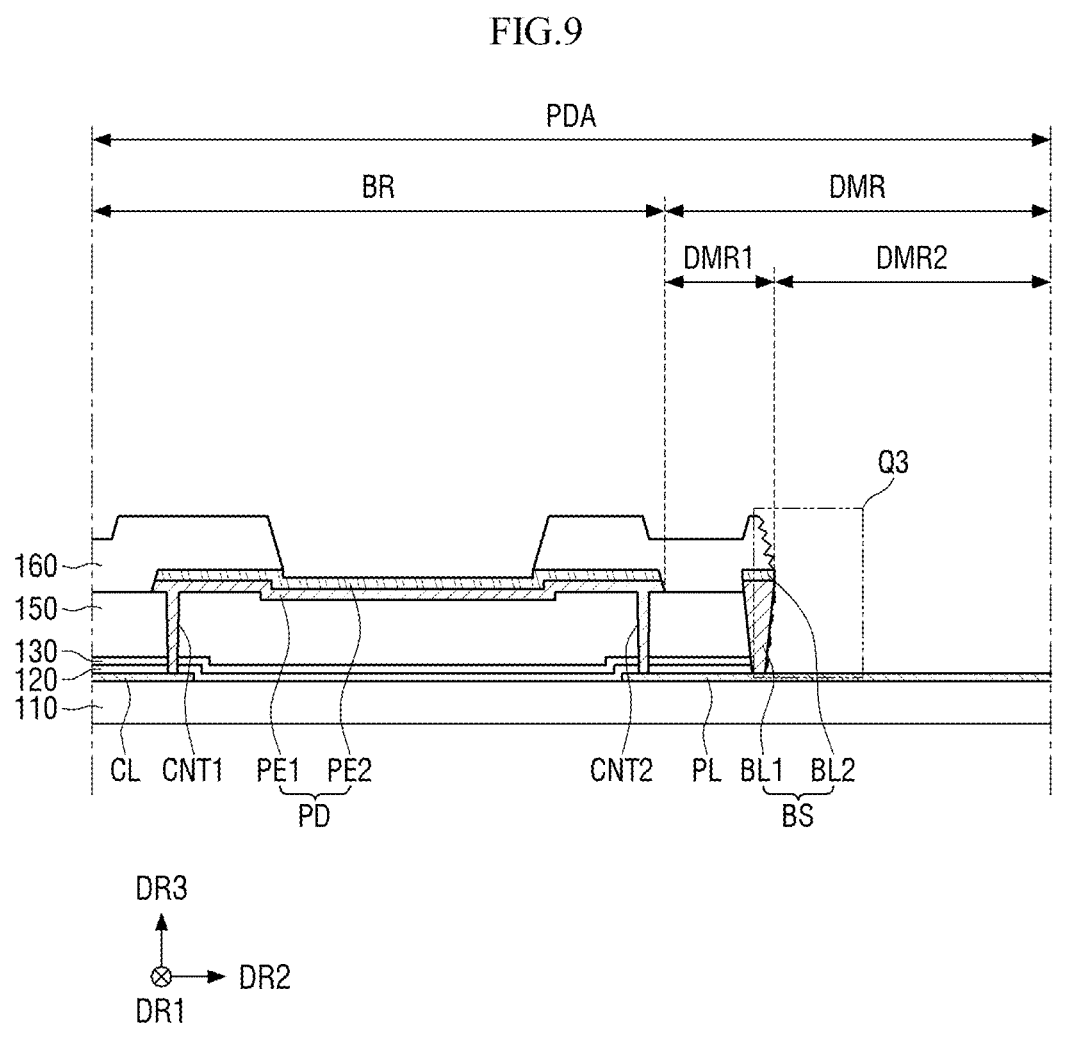
Figure 10:
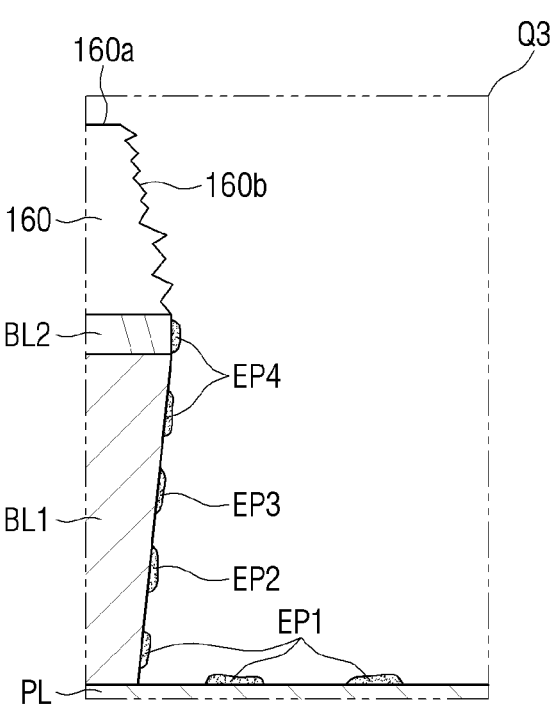
FIG. 10 is an enlarged view of area Q3 of FIG. 9.

FIG. 8 is a cross-sectional view illustrating a state in which a flexible circuit board is being separated from a pad area according to an embodiment. FIG. 9 is a cross-sectional view illustrating a state in which the flexible circuit board is separated from the pad area according to an embodiment. FIG. 10 is an enlarged view of area Q3 of FIG. 9.

Specifically, FIGS. 8 to 10 are views exemplarily illustrating any one pad PD among the plurality of pads PD included in the pad area PDA illustrated in FIG. 6 for simplicity of description, peeling may occur in some of the plurality of pads PD included in the pad area PDA as illustrated in FIGS. 8 and 9 in the process of detaching a first flexible circuit board FPC1, and peeling may not occur in some of the plurality of pads PD. Hereinafter, a case in which peeling occurs among the plurality of pads PD will be described.

Referring to FIGS. 8 and 9, as described above, the first flexible circuit board FPC1 to which the lead electrode LDE is attached to one surface of the first flexible circuit board FPC1 is attached to the pad area PDA by the anisotropic conductive film ACF including an insulating resin SL and the plurality of conductive balls CB dispersed in the insulating resin SL.

After determining whether the contact between the lead electrode LDE and the pad PD is defective by an inspection line PL and the inspection pad (not illustrated) positioned in the dummy area DMR, when it is determined to be defective, the first flexible circuit board FPC1 is removed from the pad area PDA.

When the first flexible circuit board FPC1 is removed from the pad area PDA, the first flexible circuit board FPC1 is removed from the end of the first substrate 110 positioned in the dummy area DMR toward the third direction DR3. In this process, the buffer layer 120, the first insulating layer 130, the second insulating layer 140, and the third insulating layer 160 positioned in the second dummy area DMR2 may be peeled off by an external force in the third direction DR3.

In an embodiment, the third insulating layer 160 positioned in the second dummy area DMR2 may be peeled off by an external force in the third direction DR3, and the buffer layer 120, the first insulating layer 130, and the second insulating layer 140 sequentially stacked under the third insulating layer 160 may also be peeled off together.

In this process, the peeling of each of the layers positioned in the second dummy area DMR2 may be effectively prevented from continuously propagating to each of the layers positioned in the first dummy area DMR1 and the bonding area BR by the peeling prevention structure BS positioned in the first dummy area DMR1.

In an embodiment, the peeling prevention structure BS penetrates (or is defined through) the buffer layer 120, the first insulating layer 130, and the second insulating layer 140 in the first dummy area DMR1 and is in contact with the inspection line PL, so that the buffer layer 120, the first insulating layer 130, and the second insulating layer 140 positioned in the first dummy area DMR1 and the second dummy area DMR2 may be disconnected. Accordingly, the peeling of the buffer layer 120, the first insulating layer 130, and the second insulating layer 140 positioned in the second dummy area DMR2 may be disconnected without continuously propagating to each of the layers positioned in the first dummy area DMR1.

In an embodiment, the peeling force toward the third insulating layer 160 positioned in the second dummy area DMR2 may be weakened by the upper area of the other side surface of the peeling prevention structure BS having a reverse taper shape. In such an embodiment, the other side surface of the peeling prevention structure BS facing the second dummy area DMR2 and in contact with the third insulating layer 160 has a reverse taper shape, so that resistance to the peeling force may be generated while the third insulating layer 160 is in contact with the other side surface of the peeling prevention structure BS. Accordingly, the peeling of the third insulating layer 160 may not continuously propagate to the third insulating layer 160 positioned in the first dummy area DMR1, and may be stopped at the boundary of the first dummy area DMR1 and the second dummy area DMR2.

Accordingly, as illustrated in FIG. 9, the buffer layer 120, the first insulating layer 130, the second insulating layer 140, and the third insulating layer 160 may be peeled off from the second dummy area DMR2, and the end of the third insulating layer 160 at the boundary between the first dummy area DMR1 and the second dummy area DMR2 may be aligned with the boundary of the top surface of the peeling prevention structure BS.

Accordingly, in the process of removing the flexible circuit board to reuse the display device determined to be defective, damage to the pad that may occur when peeling of each of the layers continuously propagates and the peeling of the layers positioned in the peripheral area of the pad may be effectively prevented by the peeling prevention structure BS, so that the productivity of the display device may be improved.

Next, after the first flexible circuit board FPC1 is removed with reference to FIGS. 9 and 10, the other side surface of the peeling prevention structure BS positioned at the boundary between the first dummy area DMR1 and the second dummy area DMR2, the end of the third insulating layer 160, and the top surface of the inspection line PL positioned in the second dummy area DMR2 will be described.

Referring to FIGS. 9 and 10, the other side surface of the peeling prevention structure BS positioned at the boundary between the first dummy area DMR1 and the second dummy area DMR2 may further include a residue of each of the layers positioned in the second dummy area DMR2 in the detaching process of the first flexible circuit board FPC1.

In an embodiment, the other side surface of the first peeling prevention structure layer BL1 is in contact with the buffer layer 120, the first insulating layer 130, the second insulating layer 150, and the third insulating layer 160 sequentially stacked on the second dummy area DMR2 before the first flexible circuit board FPC1 is detached, so that each area of the other side surface of the first peeling prevention structure layer BL1 that has been in contact with each of the layers described above may include a residue pattern EP remaining in the process in which each of the layers is peeled off.

In addition, as each of the layers in contact with the inspection line PL is peeled off in the second dummy area DMR2, the inspection line PL may be exposed, and accordingly, the residue pattern EP may also exist on the top surface of the inspection line PL.

That is, the area of the other side surface of the first peeling prevention structure layer BL1 that has been in contact with the buffer layer 120 and the top surface of the inspection line PL may include a first residue pattern EP1 including a same material as the material of the buffer layer 120. The area of the other side surface of the first peeling prevention structure layer BL1 that has been in contact with the first insulating layer 130 may include a second residue pattern EP2 including a same material as the material of the first insulating layer 130. The area of the other side surface of the first peeling prevention structure layer BL1 that has been in contact with the second insulating layer 150 may include a third residue pattern EP3 including a same material as the material of the second insulating layer 150. The area of the other side surface of the first peeling prevention structure layer BL1 that has been in contact with the third insulating layer 160 may include a fourth residue pattern EP4 including the same material as the material of the third insulating layer 160.

The area of the other side surface of the second peeling prevention structure layer BL2 that has been in contact with the third insulating layer 160 may include the fourth residue pattern EP4 including a same material as the material of the third insulating layer 160.

Accordingly, the other side surface of the peeling prevention structure BS may include the first residue pattern EP1, the second residue pattern EP2, the third residue pattern EP3, and the fourth residue pattern EP4, and the residue patterns EP may be sequentially positioned along the upper area from the lower area of the other side surface of the peeling prevention structure BS.

FIGS. 9 and 10 illustrate a case where each of the layers positioned in the second dummy area DMR2 is peeled off in the process in which the first flexible circuit board FPC1 is detached and thus residue patterns EP remain in the area that has been in contact with each layer, but the disclosure is not limited thereto. In some embodiments, only some of the layers positioned in the second dummy area DMR2 may be peeled off due to the peeling prevention structure BS, and some of the layers disposed in the second dummy area DMR2 may remain. In an embodiment, for example, only the third gate insulating layer 160 positioned in the second dummy area DMR2 may be peeled off, or the buffer layer 120 may remain and layers stacked thereabove may be peeled off.

At the boundary between the first dummy area DMR1 and the second dummy area DMR2, a top surface 160a and a side surface 160b of the third insulating layer 160 aligned with the boundary of the top surface of the peeling prevention structure BS may have different surface roughness from each other.

In an embodiment, the top surface 160a of the third insulating layer 160 positioned at the boundary between the first dummy area DMR1 and the second dummy area DMR2 may have relatively smoother surface roughness than the side surface 160b of the third insulating layer 160 positioned at the boundary of the first dummy area DMR1 and the second dummy area DMR2. In such an embodiment, the side surface 160b of the third insulating layer 160 positioned at the boundary between the first dummy area DMR1 and the second dummy area DMR2 may have more curved surface roughness than the top surface 160a of the third insulating layer 160 positioned at the boundary of the first dummy area DMR1 and the second dummy area DMR2. This is because direct disconnection does not occur in the top surface 160a of the third insulating layer 160 positioned at the boundary between the first dummy area DMR1 and the second dummy area DMR2 during the above-described detachment process of the first flexible circuit board FPC1 but in the side surface 160b of the third insulating layer 160, the direct layer disconnection of the third insulating layer 160 positioned in the first dummy area DMR1 and the second dummy area DMR2 occurs due to the peeling prevention structure BS, so that different surface roughness from each other may be obtained during the peeling process.

Figure 11:
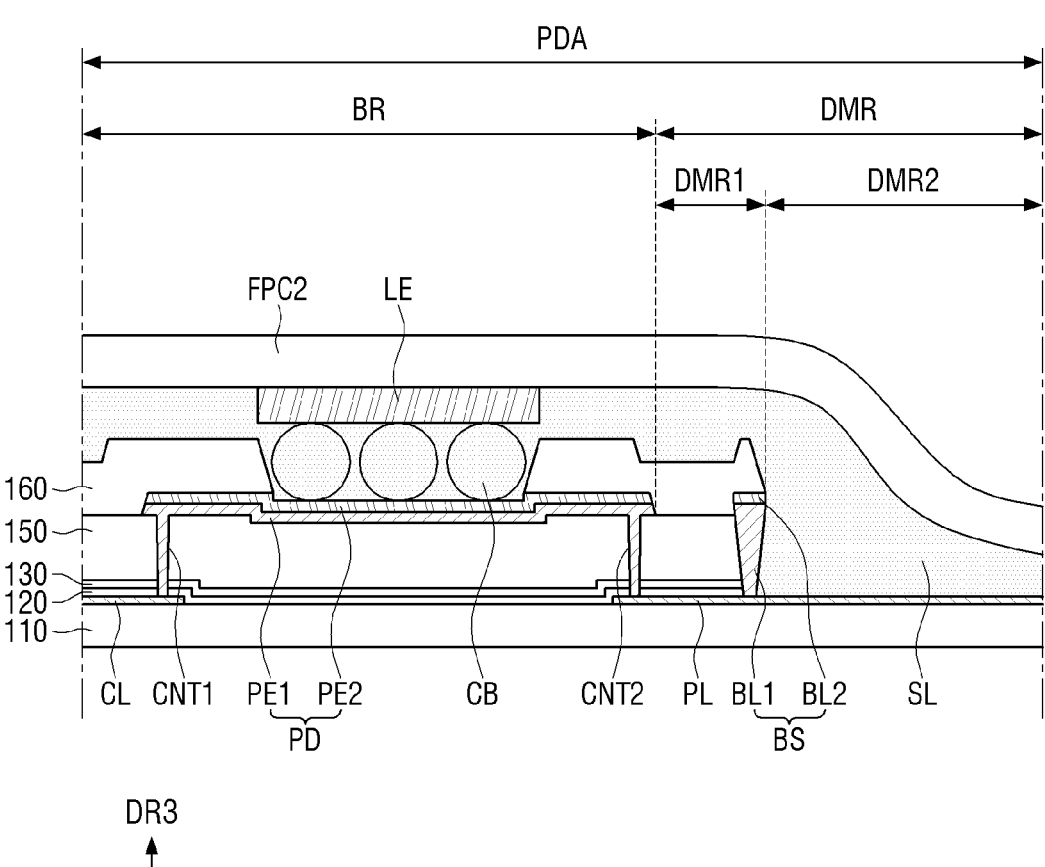
FIG. 11 is a cross-sectional view illustrating a state in which a flexible circuit board is reattached to a pad area according to an embodiment.

FIG. 11 is a cross-sectional view illustrating a state in which a flexible circuit board is reattached to a pad area according to an embodiment. Specifically, FIG. 11 is a cross-sectional view illustrating a state in which a second flexible circuit board FPC2 is attached to the pad area PDA after the first flexible circuit board FPC1 is removed from the pad area PDA.

Referring to FIG. 11, as described above, in the detachment process of the first flexible circuit board FPC1 in FIG. 9, the peeling prevention structure BS prevents the peeling of each of the insulating layers that occurs in the second dummy area DMR2 from continuously propagating to the first dummy area DMR1 and the bonding area BR, so that the peripheral area of the pad area PDA in which the pad PD is positioned may not be damaged. Accordingly, the second flexible circuit board FPC2 may be attached to the pad area PDA of the first substrate 110 to be reused, and when it is determined to be normal through the inspection, the end of the first substrate 110 may be cut. In this process, a part of the inspection line PL (see FIG. 10) remains, and the remaining inspection line PL is referred to as the dummy line DE.

The lead electrode LDE disposed on one surface of the second flexible circuit board FPC2 may overlap the second pad electrode PE2 of the pad PD exposed by the third insulating layer 160.

The anisotropic conductive film ACF may be disposed between the lead electrode LDE and the second pad electrode PE2. The anisotropic conductive film ACF may be directly in contact with the lead electrode LDE LE-and the second pad electrode PE2 exposed by the third insulating layer 160.

The anisotropic conductive film ACF may include the insulating resin SL and the conductive balls CB dispersed in the insulating resin SL. There may be the plurality of conductive balls CB dispersed in the insulating resin SL. The lead electrode LDE and the pad PD may be electrically connected through the plurality of conductive balls CB.

The insulating resin SL may include or be made of an insulating material. The insulating resin SL may be made of thermoplastic resin such as styrene butadiene resin or polyvinyl butylene resin, or thermosetting resin such as epoxy resin, polyurethane resin, or acrylic resin.

Alternatively, the insulating resin SL may include or be made of ultraviolet curable resin such as epoxy acrylate, urethane acrylate, unsaturated polyester resin, polyester acrylate, polyether acrylate or unsaturated acrylic resin.

In the bonding area BR and the first dummy area DMR1, the insulating resin SL may be in direct contact with the third insulating layer 160, and in the bonding area BR, the thickness of the insulating resin SL positioned between the lead electrode LDE and the second pad electrode PE2 may be thinner than the thickness of the insulating resin SL positioned in other areas due to compression.

In the second dummy area DMR2, unlike the bonding area BR and the first dummy area DMR1, a plurality of insulating layers are not disposed, and thus the insulating resin SL in the second dummy area DMR2 may be in direct contact with the top surface of the dummy line DE and the other side surface of the peeling prevention structure BS.

In addition, the thickness of the insulating resin SL positioned in the second dummy area DMR2 may be thicker than the thickness of the insulating resin SL positioned in other areas, and the second flexible circuit board FPC2 positioned in the second dummy area DMR2 may partially include a curved surface.

Hereinafter, alternative embodiments of the display device will be described. In the following embodiments, any repetitive detailed description of the same components as those of the above-described embodiment will be omitted or simplified, and differences will be mainly described.

Figure 12:
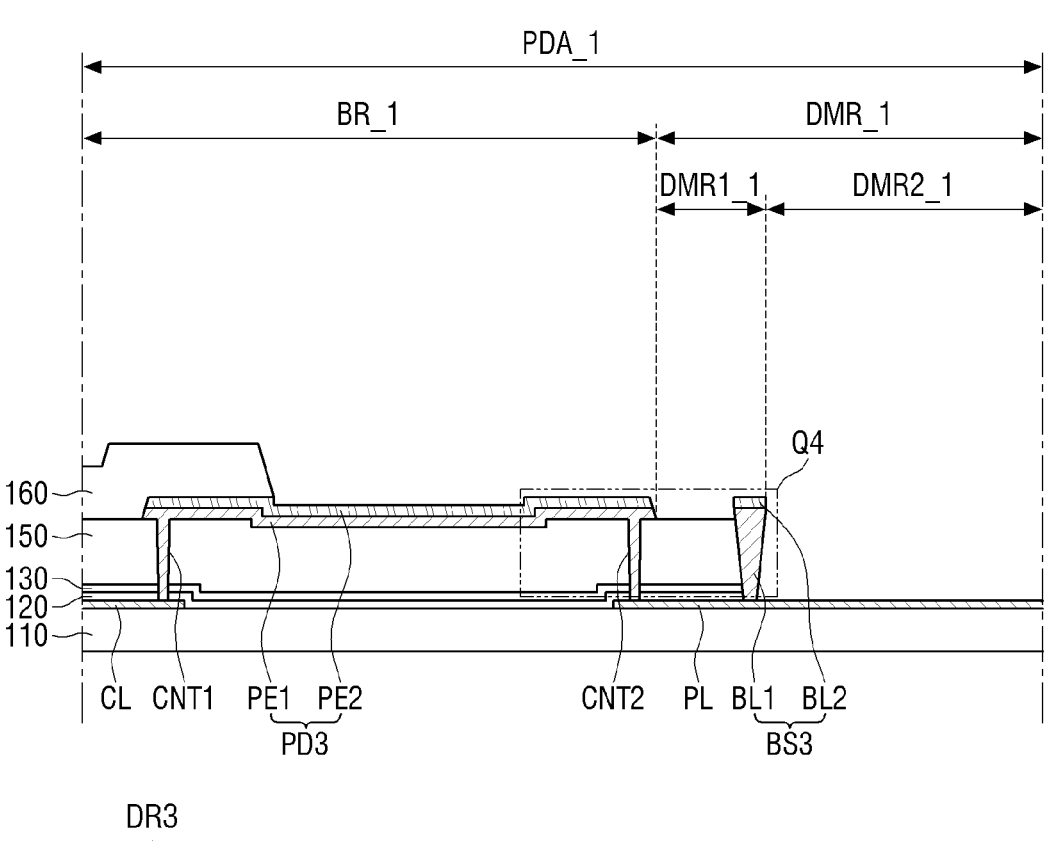
FIG. 12 is a cross-sectional view schematically illustrating a cross section taken along line II-II' of FIG. 6 according to an alternative embodiment.
Figure 12:
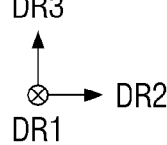
Figure 13:
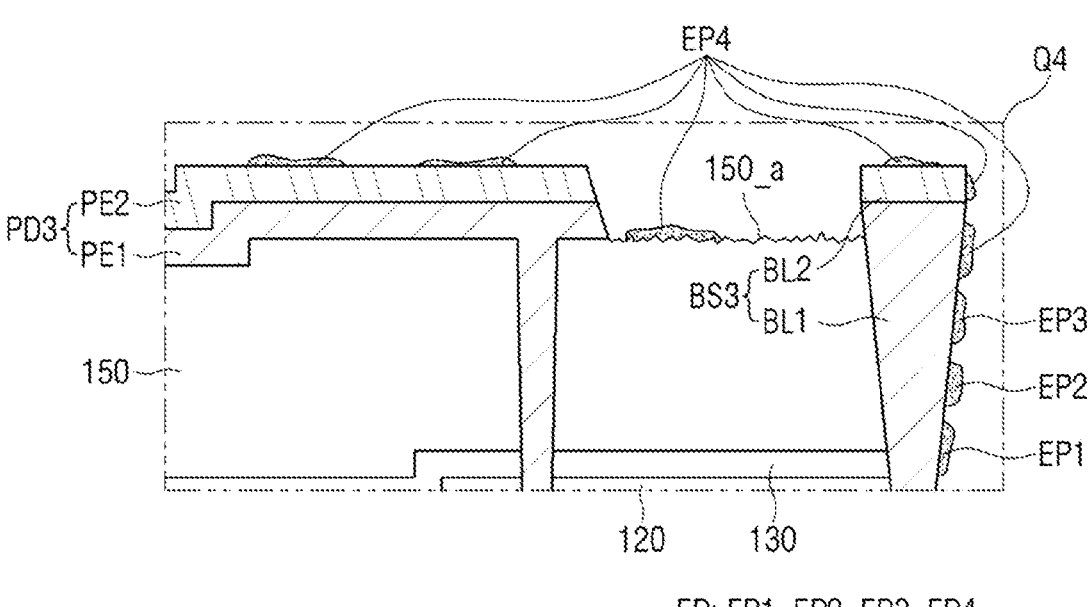
FIG. 13 is an enlarged view of area Q4 of FIG. 12.

FIG. 12 is a cross-sectional view schematically illustrating a cross section taken along line II-II' of FIG. 6 according to an alternative embodiment. Specifically, FIG. 12 is a cross-sectional view illustrating a cross section of a pad area PDA_1 including the third pad PD3 among the plurality of pads PD disposed in the pad area PDA_1 according to another embodiment. FIG. 13 is an enlarged view of area Q4 of FIG. 12.

The embodiment illustrated in FIG. 12 is substantially the same as the embodiment illustrated in FIG. 7 except that the third insulating layer 160 is not disposed on the second pad electrode PE2 positioned at the boundary between a bonding area BR_1 and a first different dummy area DMR1_1 and the second peeling prevention structure layer BL2 positioned in the first dummy area DMR_1.

In such an embodiment, in conjunction with FIGS. 9 and 10, the peeling of the third insulating layer 160 occurring in a second dummy area DMR2_1 in the process in which the first flexible circuit board FPC1 is detached from the pad area PDA continuously propagates to the third insulating layer 160 positioned in the first dummy area DMR1_1 and on one side of the bonding area BR_1, so that the third insulating layer 160 positioned in a partial area of the first dummy area DMR1_1 and the bonding area BR_1 may be peeled off. Accordingly, the area of the top surface of the second pad electrode PE2 exposed by the third insulating layer 160 may be further increased.

In addition, as the third insulating layer 160 is peeled off, the top surface of the second gate insulating layer 150 positioned between the second pad electrode PE2 of the third pad PD and the second peeling prevention structure layer BL2 of the third peeling prevention structure BS3 may be exposed.

Referring to FIG. 13, in an embodiment, the top surface of the second pad electrode PE2 positioned in the first dummy area DMR_1 and on one side of the bonding area BR_1, a top surface 150_a of the second insulating layer 160, and the top surface of the second peeling prevention structure layer BL2 of the third peeling prevention structure BS3 may further include a residue of the peeled third insulating layer 160.

In such an embodiment, the top surface of the second pad electrode PE2 that has been in contact with the third insulating layer 160, a top surface 150_a of the second insulating layer 160, and the top surface of the second peeling prevention structure layer BL2 of the third peeling prevention structure BS3 may further include the fourth residue pattern EP4 including the same material as the third insulating layer 160.

In addition, as the third insulating layer 160 is peeled off, the top surface 150_a of the second gate insulating layer 150 positioned between the second pad electrode PE2 and the second peeling prevention structure layer BL2 may have rougher surface roughness than the top surface of the third insulating layer 160 disposed on the second pad electrode PE2 at the other side of the bonding area BR. That is, in the top surface 150_a of the second insulating layer 150 exposed as the third insulating layer 160 is peeled off, direct peeling may occur at the boundary of the bottom surface of the third insulating layer 160 in the process in which the third insulating layer 160 is peeled off, and thus the top surface 150_a of the second insulating layer 150 exposed as the third insulating layer 160 is peeled off may partially include a curvature. That is, the top surface 150_a of the second insulating layer 150 including the curvature may have relatively rougher surface roughness than the top surface of the third insulating layer 160 disposed on the second pad electrode PE2 at the other side of the bonding area BR.

Figure 14:
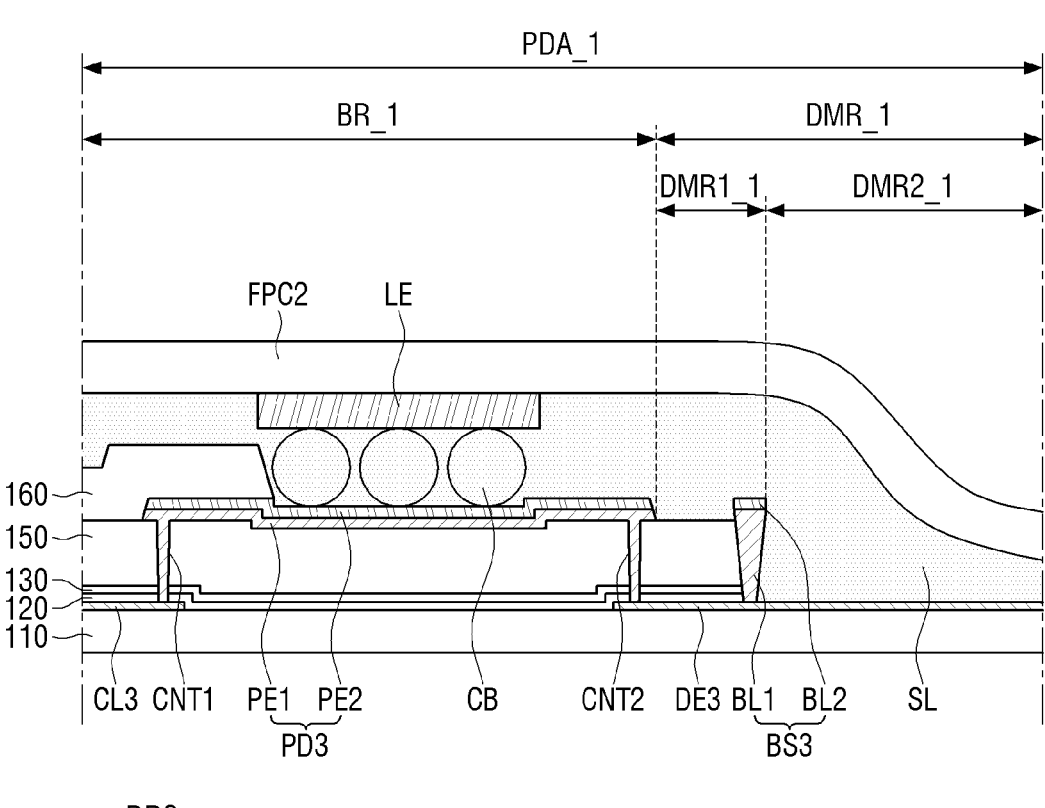
FIG. 14 is a cross-sectional view illustrating a state in which a flexible circuit board is reattached to a pad area according to an alternative embodiment.
Figure 14:
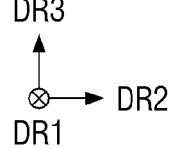

FIG. 14 is a cross-sectional view illustrating a state in which a flexible circuit board is reattached to a pad area according to alternative embodiment.

The embodiment according to FIG. 14 is substantially the same as the embodiment according to FIG. 11 except that in the process in which the second flexible circuit board FPC2 is reattached to the pad area PDA_1 through the anisotropic conductive film ACF, the insulating resin SL of the anisotropic conductive film ACF is directly in contact with the top surface of the second pad electrode PE2 positioned in the bonding area BR_1, the top surface of the second insulating layer 160, and the top surface of the second peeling prevention structure layer BL2 of the third peeling prevention structure BS3. Accordingly, the thickness of the insulating resin SL positioned on one side of the bonding area BR_1 and in the first dummy area DMR_1 may be thicker than the thickness of the insulating resin SL positioned on the other side of the bonding area BR_1.

Figure 15:
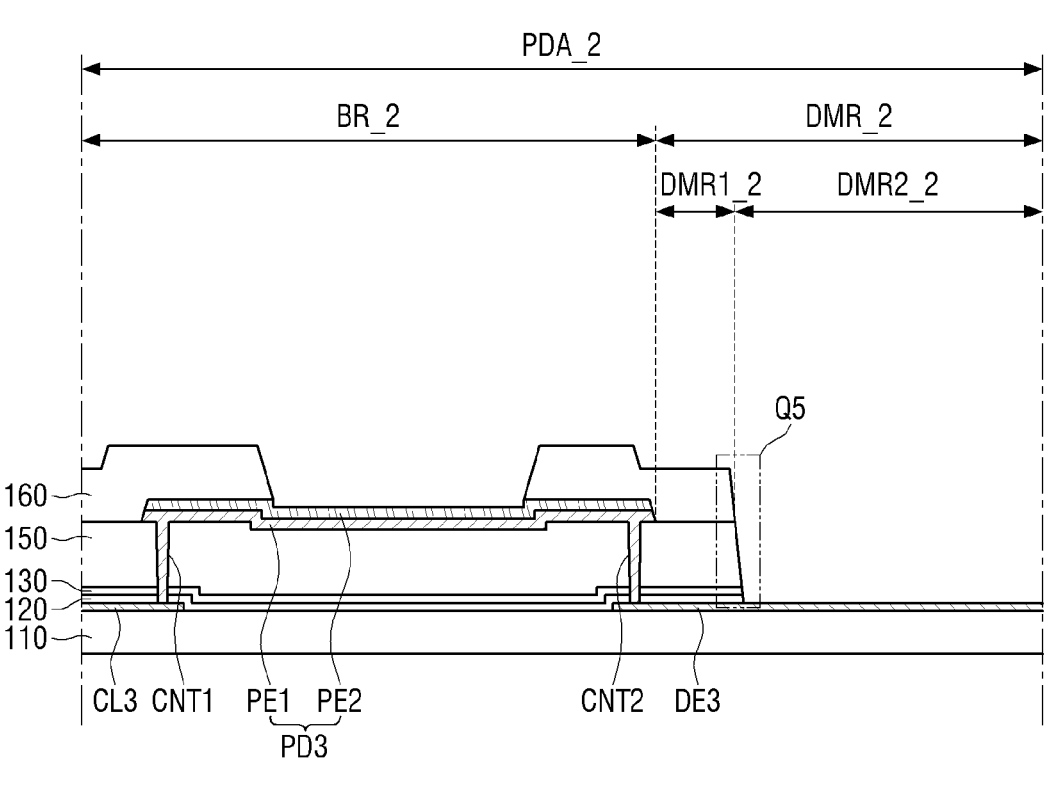
FIG. 15 is a cross-sectional view schematically illustrating a cross section taken along line II-II' of FIG. 6 according to another alternative embodiment.
Figure 15:
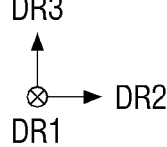
Figure 16:
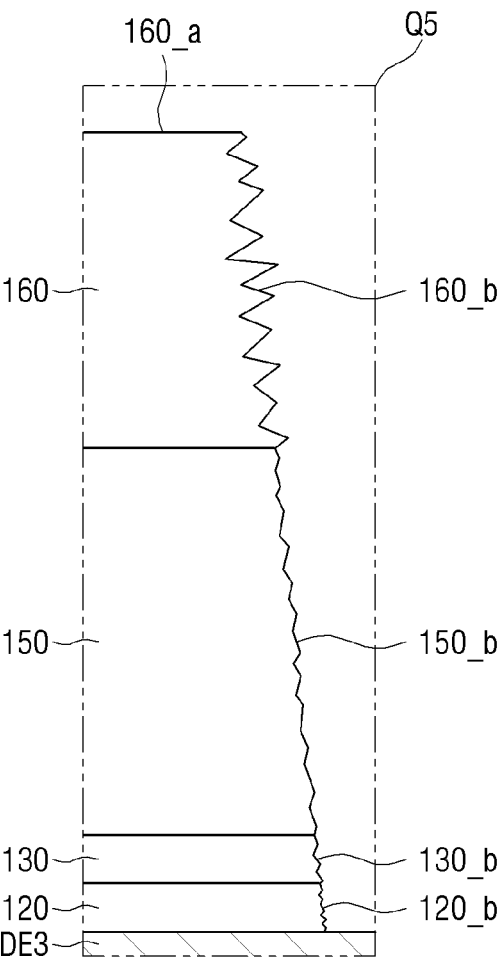
FIG. 16 is an enlarged view of area Q5 of FIG. 15.

FIG. 15 is a cross-sectional view schematically illustrating a cross section taken along line II-II' of FIG. 6 according to another alternative embodiment. Specifically, FIG. 15 is a cross-sectional view illustrating a cross section of a bonding area BR_2 of a pad area PDA_2 and a second dummy area DMR_2 of the a pad area PDA_2 including the third pad PD3 among the plurality of pads PD disposed in the pad area PDA_2 according to still another embodiment. FIG. 16 is an enlarged view of area Q5 of FIG. 15.

The embodiment according to FIG. 15 is substantially the same as the embodiment according to FIG. 7 except that the peeling prevention structure BS is not disposed in a first dummy area DMR1_2. That is, in conjunction with FIGS. 9 and 10, in the process in which the first flexible circuit board FPC1 is detached from the pad area PDA_2, the peeling prevention structure BS is detached together, so that the peeling prevention structure BS may not be disposed in the first dummy area DMR1_2.

Referring to FIG. 16, a side surface 160_b of the third insulating layer 160 positioned at the boundary between the first dummy area DMR1_2 and a second dummy area DMR2_2 may have relatively rougher surface roughness than a side surface 120_b of the buffer layer 120, a side surface 130_b of the first insulating layer 130, and a side surface 150_b of the second insulating layer 150 positioned at the boundary of the first dummy area DMR1_2 and the second dummy area DMR2_2.

In such an embodiment, as described above, the side surface 160_b of the third insulating layer 160 may include a curvature due to the direct layer disconnection of the third insulating layer 160 positioned in the second dummy area DMR2_2 during the detachment process of the first flexible circuit board FPC1.

In comparison, the side surface 120_b of the buffer layer 120, the side surface 130_b of the first insulating layer 130, and the side surface 150_b of the second insulating layer 150 that are directly in contact with the side surface of the peeling prevention structure BS and are positioned at the boundary of the first dummy area DMR1_2 and the second dummy area DMR2_2 may partially have a curvature due to a frictional force generated during the detachment process of the peeling prevention structure BS.

Since the surface due to the direct layer disconnection may include more curvature than the surface roughness due to a frictional force, the surface of the side surface 160_b of the third insulating layer 160 may have rougher surface roughness than the surface of the side surface 120_b of the buffer layer 120, the side surface 130_b of the first insulating layer 130, and the side surface 150_b of the second insulating layer 150. In such an embodiment, the surface of the side surface 120_b of the buffer layer 120, the side surface 130_b of the first insulating layer 130, and the side surface 150_b of the second insulating layer 150 may have a relatively smooth surface than the side surface 160_b of the third insulating layer 160.

In addition, the side surface 160_b of the third insulating layer 160, the side surface 120_b of the buffer layer 120, the side surface 130_b of the first insulating layer 130, and the side surface 150_b of the second insulating layer 150 may have different surface roughnesses from each other.

Figure 17:
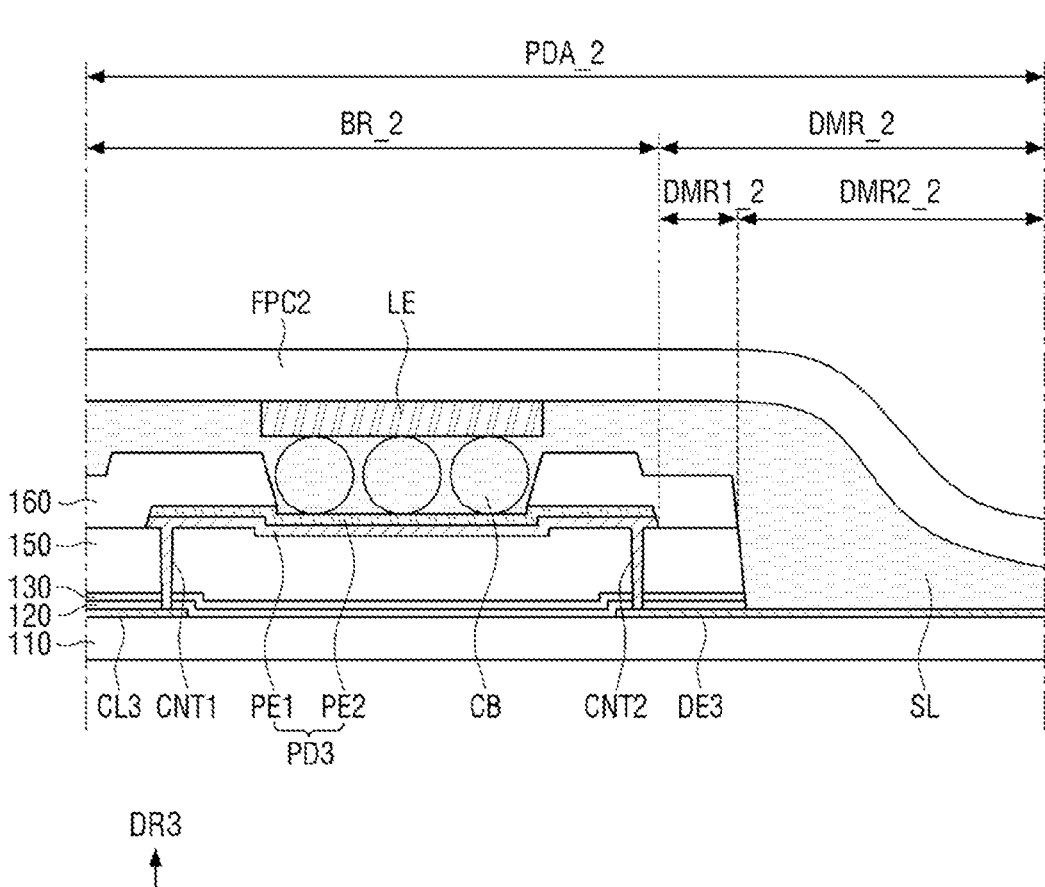
FIG. 17 is a cross-sectional view illustrating a state in which a flexible circuit board is reattached to a pad area according to another alternative embodiment.

FIG. 17 is a cross-sectional view illustrating a state in which a flexible circuit board is reattached to a pad area according to another alternative embodiment.

The embodiment of FIG. 17 is substantially the same as the embodiment of FIG. 11 except that in the process in which the second flexible circuit board FPC2 is reattached to the pad area PAD_2 including the bonding area BR 2 and the second dummy area DMR_2 through the anisotropic conductive film ACF, the insulating resin SL of the anisotropic conductive film ACF is directly in contact with the side surface 120_b of the buffer layer 120, the side surface 130_b of the first insulating layer 130, the side surface 150_b of the second insulating layer 150, and the side surface 160_b of the third insulating layer 160 that are positioned at the boundary between the first dummy area DMR1_2 and the second dummy area DMR2_2.

Each of the layers positioned in the peripheral area of the plurality of pads PD positioned in the pad area PDA illustrated in FIGS. 1 and 6 may have different peeling layers in each area due to an external force acting in the process in which the flexible circuit board FPC is detached. Accordingly, the plurality of pads PD positioned in the pad area PDA may simultaneously have the cross sections of the pads PD according to the various embodiments described above. In an embodiment, for example, referring to FIG. 6, the first pad PD1 may have a cross section according to the embodiment of FIG. 7, the second pad PD2 may have a cross section according to the embodiment of FIG. 12, the third pad PD3 may have a cross section according to the embodiment of FIG. 15, and peeling of layers positioned in the peripheral area of the fourth pad PD4 may not occur.

As described above, in embodiments according to FIGS. 12 to 17, in the process of removing the flexible circuit board in order to reuse the display device determined to be defective, components disposed in the periphery of the pad area PDA are not damaged due to the peeling prevention structure, so that productivity of the display device may be improved.

Figure 18:
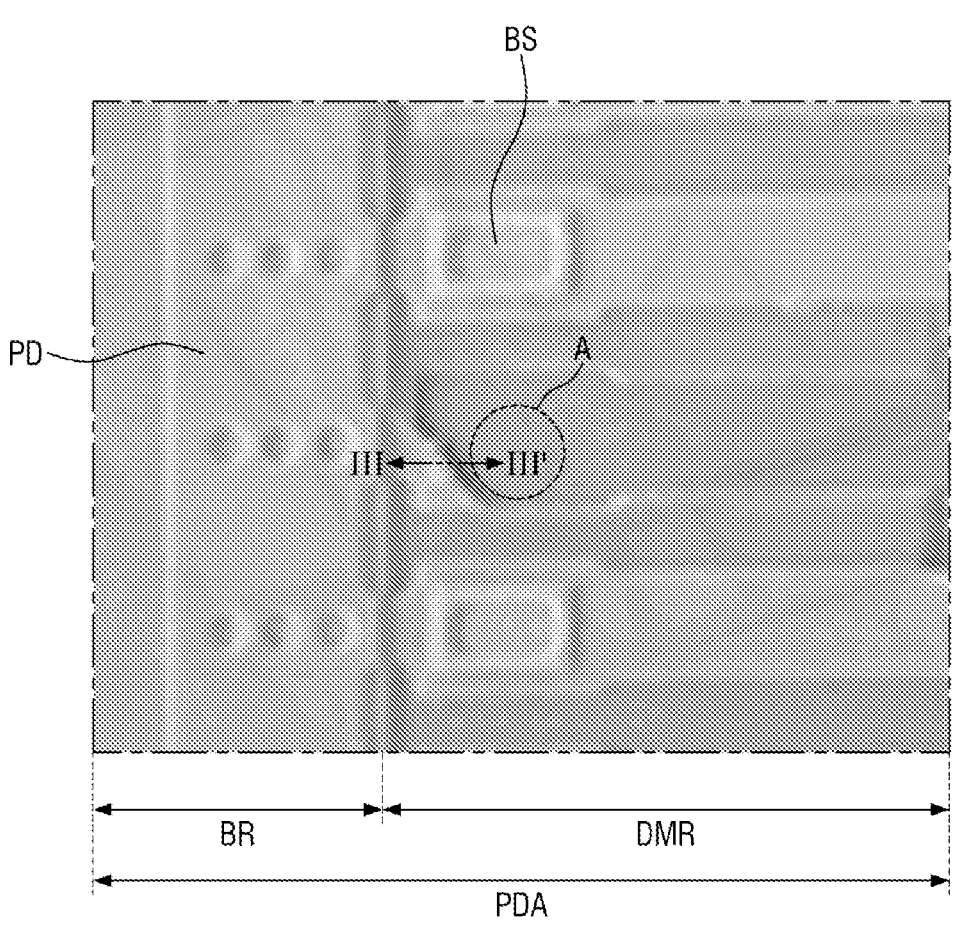
FIG. 18 is a photograph of a surface of a pad area according to an embodiment.
Figure 19:
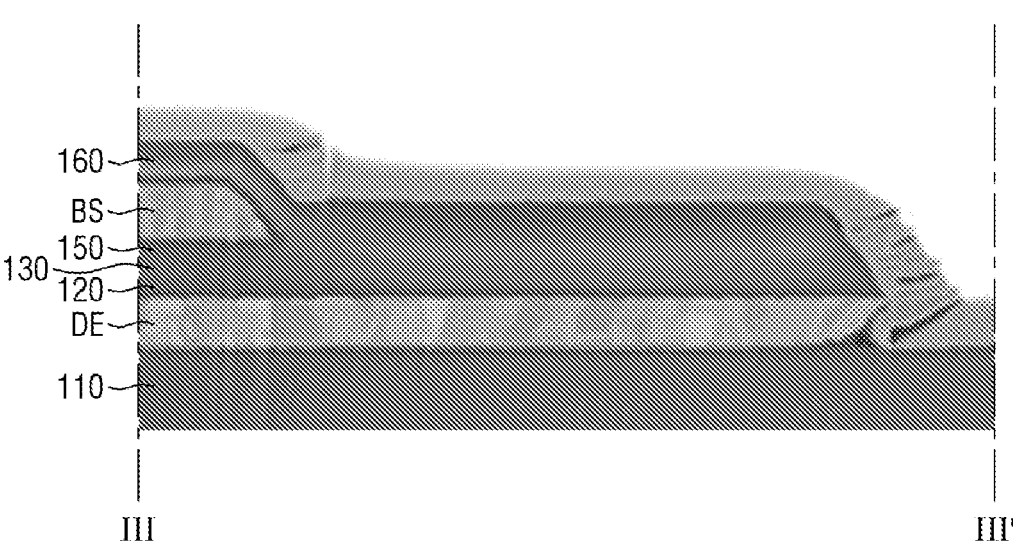
FIG. 19 is a cross-sectional view photograph taken along line III-III' of FIG. 18.

FIG. 18 is a photograph of a surface of a pad area according to an embodiment. FIG. 19 is a cross-sectional view photograph taken along line III-III' of FIG. 18.

Referring to FIG. 18, as described above in connection with FIG. 6, the pad area PDA may include the bonding area BR in which the plurality of pads PD and the plurality of connection lines CL are disposed, and the dummy area DMR in which the plurality of peeling prevention structures BS and the plurality of dummy lines DE are disposed.

As illustrated in FIG. 18, some of the plurality of peeling prevention structures BS disposed in the dummy area DMR and a plurality of insulating layers may be detached in the process of detaching the first flexible circuit board FPC (see FIG. 8) because the display device 1 is determined to be defective. In an embodiment, detachment of the insulating layers may occur only in a partial area of the dummy area DMR due to an external force that detaches the first flexible circuit board FPC1 attached to the dummy area DMR, and as described above in connection with the embodiment according to FIG. 15, the peeling prevention structure BS may be detached together. Accordingly, as illustrated in FIG. 18, when the detachment of the insulating layer occurs in an area A that is a partial area of the dummy area DMR, the peeling prevention structure BS may prevent peeling from continuously propagating to the insulating layer in the bonding area BR.

Specifically, in the process in which the third insulating layer 160 is peeled off, the peeling prevention structure BS and the plurality of insulating layers 150, 130, and 120 sequentially stacked under the third insulating layer 160 may be detached together. In addition, in the process of in which the third insulating layer 160 is peeled off, a plurality of insulating layers and the peeling prevention structure BS may remain in the dummy area DMR adjacent to the pad area PDA. The residue of the peeling prevention structure BS remains only on one side area of the dummy area DMR adjacent to the pad area PDA and does not remain on the other side of the dummy area DMR.

Referring to FIG. 19, a plurality of insulating layers remaining on one side of the dummy area DMR adjacent to the pad area PDA and the residue of the peeling prevention structure BS, as described above, are stacked in the order of the buffer layer 120, the first insulating layer 130, the second insulating layer 150, the residue of the peeling prevention structure BS, and the third insulating layer 160 on the dummy line DE disposed on the first substrate 110.

The residue of the peeling prevention structure BS does not remain on the other side of the dummy area DMR, so that the buffer layer 120, the first insulating layer 130, the second insulating layer 150, and the third insulating layer 160 are stacked in this order on the dummy line DE disposed on the first substrate 110. That is, the third insulating layer 160 remaining on the other side of the dummy area DMR may be directly in contact with the insulating layers stacked under the third insulating layer 160.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate comprising a display area, on which a plurality of pixels is disposed, and a pad area positioned in a periphery of the display area;
a first insulating layer disposed on the substrate;
a pad disposed on the first insulating layer in the pad area, the pad comprising a first pad electrode in contact with the first insulating layer and a second pad electrode positioned on the first pad electrode;
a peeling prevention structure disposed on the first insulating layer in the pad area to be spaced apart from the pad electrode, wherein the peeling prevention structure includes a first side surface facing the pad and a second side surface opposite to the first side surface; and
a second insulating layer disposed on the pad and the peeling prevention structure,
wherein
an end of the first insulating layer is in contact with the first side surface of the peeling prevention structure, and
an end of the second insulating layer is aligned with a boundary of a top surface of the peeling prevention structure.

2. The display device of claim 1, wherein the end of the second insulating layer covers a part of the second side surface and the top surface of the peeling prevention structure.

3. The display device of claim 1, wherein the first side surface and the second side surface of the peeling prevention structure have a reverse taper slope.

4. The display device of claim 1, further comprising a first residue pattern partially positioned on the second side surface of the peeling prevention structure, and a second residue pattern including a material different from the first residue pattern.

5. The display device of claim 4, wherein the first residue pattern includes a same material as the first insulating layer, and the second residue pattern includes a same material as the second insulating layer.

6. The display device of claim 1, wherein the top surface of the peeling prevention structure is higher than a top surface of the first insulating layer.

7. The display device of claim 1, further comprising:
a dummy line disposed between the substrate and the first insulating layer,
wherein the pad and the peeling prevention structure are in contact with the dummy line.

8. The display device of claim 7, wherein a top surface of the dummy line disposed on a portion of the substrate positioned outside the second side surface of the peeling prevention structure is exposed.

9. The display device of claim 7, further comprising:
a flexible circuit board comprising a lead electrode electrically connected to the pad; and
an anisotropic conductive film positioned between the flexible circuit board and the substrate,
wherein the anisotropic conductive film comprises an insulating resin and a plurality of conductive balls dispersed in the insulating resin,
wherein the lead electrode and the pad are electrically connected through the plurality of conductive balls, and
wherein the insulating resin is in direct contact with the top surface of the dummy line.

10. The display device of claim 1, wherein a top surface of the pad and the top surface of the peeling prevention structure are positioned in a same level.

11. The display device of claim 1, wherein the second insulating layer exposes at least a part of the top surface of the peeling prevention structure.

12. The display device of claim 1, wherein the pad and the peeling prevention structure include a same material as each other, and the pad and the peeling prevention structure are formed by a same process as each other.

13. The display device of claim 1,
wherein the first pad electrode and the second pad electrode include different materials from each other.

14. The display device of claim 13, wherein the peeling prevention structure comprises:
a first peeling prevention structure layer including a same material as the first pad electrode, and disposed in a same layer as the first pad electrode; and
a second peeling prevention structure layer including a same material as the second pad electrode, and disposed in a same layer as the second pad electrode.

15. A display device comprising:
a substrate comprising a display area, on which a plurality of pixels is disposed, and a pad area positioned in a periphery of the display area;
a first insulating layer disposed on the substrate;
a first pad and a second pad electrode-which are disposed on the first insulating layer in the pad area and arranged in a first direction, each pad comprising a first pad electrode in contact with the first insulating layer and a second pad electrode positioned on the first pad electrode;
a first peeling prevention structure disposed on the first insulating layer in the pad area to be spaced apart from the first pad in a second direction intersecting the first direction, wherein the first peeling prevention structure includes a first side surface facing the first pad and a second side surface opposite to the first side surface thereof;
a second peeling prevention structure disposed on the first insulating layer in the pad area to be spaced apart from the second pad in the second direction, wherein second peeling prevention structure includes a first side surface facing the second pad and a second side surface opposite to the first side surface thereof; and
a second insulating layer disposed on the first pad, the second pad, the first peeling prevention structure, and the second peeling prevention structure,
wherein
at least a part of the substrate positioned outside the second side surface of the first peeling prevention structure is exposed, and
a portion of the substrate positioned outside the second side surface of the second peeling prevention structure is covered by the second insulating layer.

16. The display device of claim 15, wherein the first insulating layer and the second insulating layer are in contact with the second side surface of the second peeling prevention structure.

17. The display device of claim 16, further comprising:
a first residue pattern partially positioned on the second side surface of the first peeling prevention structure; and
a second residue pattern includes a material different from the first residue pattern,
wherein the first residue pattern includes a same material as the first insulating layer, and
wherein the second residue pattern includes a same material as the second insulating layer, and wherein the second residue pattern is disposed on the second side surface of the second peeling prevention structure.

18. The display device of claim 15, further comprising:
a third pad disposed on the first insulating layer in the pad area, and spaced apart from the first pad and the second pad in the first direction, the third pad comprising a first pad electrode in contact with the first insulating layer and a second pad electrode positioned on the first pad electrode,
wherein the first insulating layer and the second insulating layer cover an end of the third pad, and
wherein a side surface of the first insulating layer and a side surface of the second insulating layer which cover the end of the third pad are exposed.

19. The display device of claim 15, further comprising:
a first dummy line disposed between the substrate and the first insulating layer in the pad area and connected to the first pad; and
a second dummy line disposed between the substrate and the first insulating layer in the pad area and connected to the second pad.

20. The display device of claim 19,
wherein a top surface of the first dummy line disposed on a portion of the substrate positioned outside the second side surface of the first peeling prevention structure is exposed, and
wherein a top surface of the second dummy line disposed on a portion of the substrate positioned outside the second side surface of the second peeling prevention structure is covered by the first insulating layer and the second insulating layer.

* * * * *